(12) United States Patent
Bidaux et al.

(10) Patent No.: US 11,287,485 B2
(45) Date of Patent: Mar. 29, 2022

(54) MAGNETIC POSITION SENSOR SYSTEM

(71) Applicant: Melexis Technologies SA, Bevaix (CH)

(72) Inventors: Yves Bidaux, Yverdon-les-Bains (CH); Jean-Claude Depoorter, Paal (BE)

(73) Assignee: MELEXIS TECHNOLOGIES SA, Bevaix (CH)

( * ) Notice: Subject to any disclaimer, the term of this patent is extended or adjusted under 35 U.S.C. 154(b) by 56 days.

(21) Appl. No.: 17/023,798

(22) Filed: Sep. 17, 2020

(65) Prior Publication Data

US 2021/0088603 A1    Mar. 25, 2021

(30) Foreign Application Priority Data

Sep. 23, 2019   (EP) .................................... 19199051

(51) Int. Cl.
*G01R 33/02* (2006.01)
*G01D 5/14* (2006.01)

(52) U.S. Cl.
CPC ............. *G01R 33/02* (2013.01); *G01D 5/145* (2013.01)

(58) Field of Classification Search
CPC .................. G01R 33/02–10; G01D 5/12–2525
See application file for complete search history.

(56) References Cited

U.S. PATENT DOCUMENTS

| | | |
|---|---|---|
| 2002/0021124 A1 | 2/2002 | Schott et al. |
| 2003/0011455 A1* | 1/2003 | Wakuda ............. G01R 33/3806 335/299 |
| 2003/0052669 A1* | 3/2003 | Enomoto ............... G01D 5/145 324/207.25 |
| 2010/0023297 A1* | 1/2010 | Kikuchi ................ B23F 23/006 702/150 |
| 2010/0134095 A1 | 6/2010 | Loreit et al. |

FOREIGN PATENT DOCUMENTS

| | | |
|---|---|---|
| EP | 3543656 A1 | 9/2019 |
| EP | 3543657 A1 | 9/2019 |
| EP | 3581893 A1 | 12/2019 |
| GB | 2313444 A | 11/1997 |
| JP | 2004056936 A | 2/2004 |
| WO | 9854547 A1 | 12/1998 |
| WO | 2014029885 A1 | 2/2014 |

OTHER PUBLICATIONS

Extended Search Report from corresponding EP Application No. 19199051.4, dated May 15, 2020.

* cited by examiner

*Primary Examiner* — Huy Q Phan
*Assistant Examiner* — David B Frederiksen
(74) *Attorney, Agent, or Firm* — Workman Nydegger

(57) ABSTRACT

A linear or angular position sensor system comprising a magnetic structure for generating a magnetic field, and a sensor device movable relative to the magnetic structure. The sensor device comprises a plurality of sensor elements for measuring at least two characteristics of said magnetic field, and a processing circuit for determining a linear or angular position of the sensor device relative to the magnetic structure in accordance with a predefined function of these characteristics (e.g. components or gradients). The magnetic structure comprises one or more grooves, having a shape and size which can be described by a limited set of parameters, having values optimized to reduce a maximum error between the actual position of the sensor device, and the calculated position based on said predefined function, by at least a factor of 2.

21 Claims, 18 Drawing Sheets

$\theta_C = \arctan(dBx/dx \,/\, dBz/dx)$ $\theta_C = \arctan(Bx/Bz)$

Bx=tangential component,
Bz=radial component
Bx, Bz are 90° phase shifted $\theta_c = \arctan(dBx/dx \,/\, dBz/dx)$

| h1 | 3.2 mm |
|----|--------|
| Do | 21 mm |
| Di | 5 mm |
| d1 | 1.4 mm |
| d2 | 2.9 mm |
| h2 | 2.9 mm |
| h3 | 2.6 mm | grooves optimized such that difference between mechanical angle: $\theta_m$ and calculated angle: $\theta_c = \arctan 2\left(\dfrac{\delta B_t}{\delta x}, \dfrac{\delta B_z}{\delta x}\right)$ is minimal, over the measurement range (e.g. from 0° to 360°)

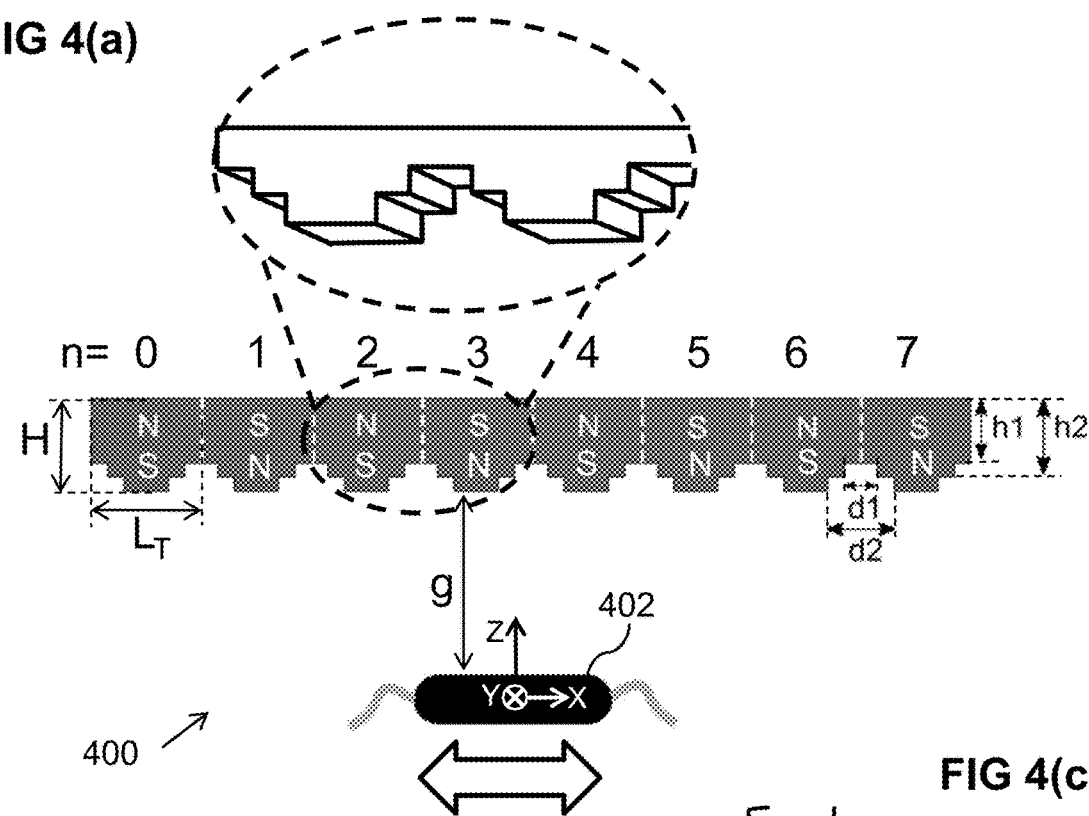
FIG 4(a)
FIG 4(b)
FIG 4(c)
| | | |
|---|---|---|
| $L_T$ | 5 mm | given |
| g | 2 mm | |
| W | 8 mm | |
| L | 40 mm | |
| H | 3.5 mm | |
| h1 | 2.8 mm | optimized |
| h2 | 3.15 mm | |
| d1 | 0.5 mm | |
| d2 | 1 mm | |
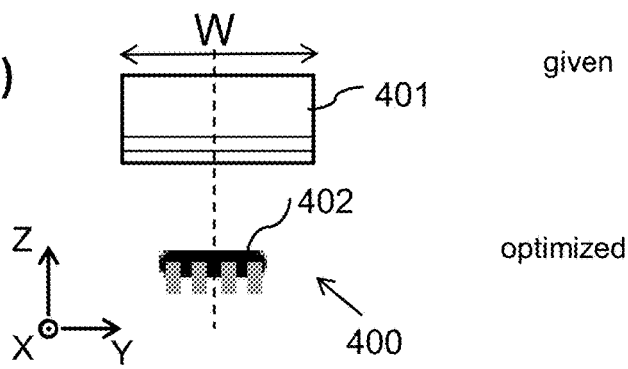
Bx=tangential component,
Bz=normal component
Bx, Bz are 90° phase shifted
$$\theta_c = \arctan 2\left(\frac{\delta B_x}{\delta x}, \frac{\delta B_z}{\delta x}\right)$$
$$x = n \cdot L_T + K \cdot \theta_c \quad ; \quad n = \text{tooth number}; K = (L_T)/360°$$
FIG 4(d)

$\theta c = \arctan2(dBx/dx, dBy/dx)$

Bx=tangential component,
By=radial component
Bx, By are 90° phase shifted in variants:
$\theta c = \arctan2(Bx, By)$
$\theta c = \arctan2(d^2Bx/dx^2, d^2By/dx^2)$ $\theta c = \arctan2(dBx/dx, dBz/dx)$ Bx=tangential component,
Bz=radial component
Bx, Bz are 90° phase shifted in variants:
$\theta c = \arctan2(Bx, Bz)$
$\theta c = \arctan2(d^2Bx/dx^2, d^2Bz/dx^2)$ $\varepsilon_1$ = 45° mech = 90° electr $\varepsilon_2$ = 45° mech = 90° electr D1=H1-H2
D2=H3-H2
$\theta_c = \arctan(D1/D2)$ $s1 = H2-H1$
$s2 = 2*H3-H1-H2$
$\theta c = \arctan(K*s1/s2)$

FIG 13(c) $\Phi = \arctan\{(S_7 - S_6)/(S_5 - S_4)\}$

(prior art)

$\theta c = \arctan2(dBz/dx, dBz/dy)$ in variants:

$\theta c = \arctan2(d^2Bz/dx^2, d^2Bz/dy^2)$
$\theta c = \arctan2(d^2Bx/dx^2, d^2By/dy^2)$

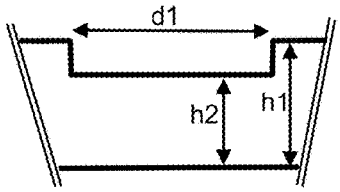

FIG 17(a)

Example 1:
Given: g, h1, r1, r2, function, single rectangular cut-out
To be optimized: d1, h2

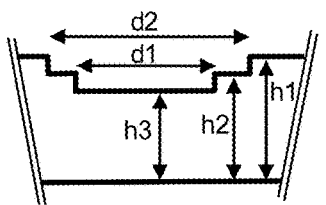

FIG 17(b)

Example 2:
Given: g, h1, r1, r2, function, two rectangular cut-outs
To be optimized: d1, d2, h2, h3

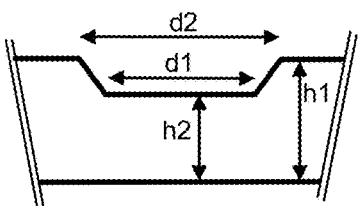

FIG 17(c)

Example 3:
Given: g, h1, r1, r2, function, trapezoidal cut-out
To be optimized: d1, d2, h2

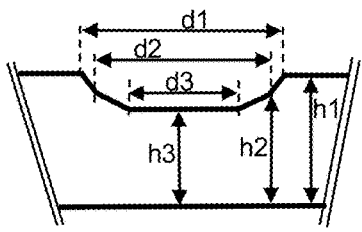

FIG 17(d)

Example 4:
Given: g, h1, r1, r2, function, polygonal
or piece-wise-linear cut-out
To be optimized: d1, d2, d3, h2, h3

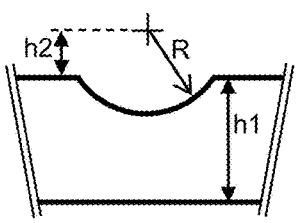

FIG 17(e)

Example 5:
Given: g, h1, r1, r2, function, circular cut-out
To be optimized: R, h2

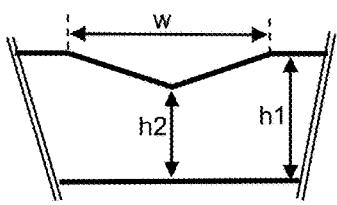

FIG 17(f)

Example 6:
Given: g, h1, r1, r2, function, triangular cut-out
To be optimized: w, h2

MAGNETIC POSITION SENSOR SYSTEM

FIELD OF THE INVENTION

The present invention relates to magnetic position sensor systems comprising a magnetic structure and a sensor device.

BACKGROUND OF THE INVENTION

Magnetic position sensor systems, in particular linear or angular position sensor systems are known in the art. In such systems typically a non-uniform magnetic field is generated (e.g. by means of a permanent magnet) and is measured by a sensor device comprising one or more sensor elements and a readout circuit and a processor which calculates a linear or angular position based on the measured values.

Various sensor arrangements and various techniques for determining an angular or linear position are known in the art, each having its advantages and disadvantages, for example in terms of cost, compactness, angular range, accuracy, signal sensitivity, robustness against unwanted external fields, robustness against position errors (e.g. axial or radial offset), processing power, processing complexity, chip area, etc.

For example, US2002021124A1 describes a sensor for the detection of the direction of a magnetic field, using a magnetic field concentrator and horizontal Hall-effect elements.

WO9854547A1 describes a magnetic rotation sensor with four sensor elements, arranged near a two-pole magnet. An angular position is calculated as an arctangent function of a ratio of difference signals. This arrangement is said to be robust against offset and sensitivity variations, and against a constant external magnetic field.

WO2014029885A1 describes a sensor arrangement for measuring an absolute angular position using a multi-pole magnet. Some embodiments described herein are highly robust against position errors, and/or robust against a constant external magnetic field, and/or robust against a constant external field gradient, for example by using a more complex algorithm, and/or by using a more complex magnet and/or a higher number of sensor elements.

There is always room for improvements or alternatives.

SUMMARY OF THE INVENTION

It is an object of embodiments of the present invention to provide a magnetic position sensor system, e.g. an angular position sensor system and/or a linear position sensor system, comprising a magnetic structure and a sensor device configured for determining a relative position of the sensor device relative to the magnetic structure.

It is an object of embodiments of the present invention to provide a position sensor system with a reduced position error.

It is an object of embodiments of the present invention to provide a position sensor system with an improved position accuracy.

It is an object of embodiments of the present invention to provide a position sensor system with a reduced position error obtained in a passive or mechanical manner.

It is an object of embodiments of the present invention to provide a position sensor system with a reduced position error, without significantly increasing processing resources (e.g. processing power, processing time, processing complexity) and/or storage capacity (e.g. size of a look-up table).

It is an object of embodiments of the present invention to provide such a position sensor system for use in automotive applications, which is furthermore highly robust against an external disturbance field.

These objectives are accomplished by a position sensor system according to embodiments of the present invention.

According to a first aspect, the present invention provides an angular position sensor system comprising: a multi-pole magnetic structure for generating a magnetic field; and a sensor device movable relative to the magnetic structure about a rotation axis, or vice versa; the sensor device comprising a plurality of sensor elements configured for measuring at least two magnetic field characteristics, and a processing circuit configured for determining an angular position of the sensor device relative to the magnetic structure in accordance with a predefined function of these at least two magnetic field characteristics; wherein the sensor device is located such that the sensor elements are located at a radial distance of at least 1.6 mm (or at least 1.8 mm, or at least 2.0 mm, or at least 2.2 mm, or at least 2.5 mm, or at least 3 mm, or at least 3.5 mm, or at least 4 mm, or at least 4.5 mm, or at least 5 mm) from said rotation axis; and said magnetic structure comprises a plurality of grooves having a shape and size which can be described by a limited set of parameters, these parameters having values which are optimized so as to reduce a maximum error between the actual position of the sensor device and the position determined in accordance with said predefined function, by at least a factor of 2, or by at least a factor 3, or by at least a factor 4, or by at least a factor 5, or by at least a factor 8, or by at least a factor 10, or to minimize the maximum error.

In other words, the sensor device is mounted in an "off-axis position".

While many prior art implementations mention that the angular position can be calculated using an arctangent function of a ratio of a sine-like and cosine-like signal, in practice the result obtained in this way is only an approximation of the real angular position, meaning that there will be an error between the real physical position and the value obtained from such an arctangent function.

In order to improve the accuracy (or decrease the error), typically an additional correction step is performed, however this correction step costs extra silicon space and/or extra processing time and/or extra processing power and/or may require performing a calibration procedure, and/or requires the storage of parameters in non-volatile memory, or combinations hereof.

The grooves may have a length larger than their width, or the grooves may have a length shorter than their width (for example in a variant of FIG. 5(a) to 5(d) or 6, where the magnet is "thin"), or may have a length substantially equal to their width (e.g. FIGS. 4(a) to 4(f), FIG. 11, FIG. 12).

Preferably, the grooves have linear or straight edges.

In an embodiment, the groove or grooves are located on a magnet surface facing the sensor device. The groove or grooves are preferably located at the transitions between north & south poles.

In an embodiment, the sensor device is located such that the sensor elements are at a distance of at least 1.8 mm, or at least 2.0 mm, or at least 2.2 mm, or at least 2.4 mm, or at least 2.6 mm, or at least 2.8 mm, or at least 3.0 mm, or at least 3.5 mm, or at least 4.0 mm from said axis.

In an embodiment, the magnet is rotatable around said rotation axis, and the sensor device is mounted at a fixed distance from said rotation axis.

In an embodiment, the sensor device is rotatable around said rotation axis, and the magnetic structure is mounted at a fixed position.

In an embodiment, the sensor device is configured for measuring at least two magnetic field components (e.g. Bx, Bz) oriented in different directions; and the processing circuit is configured for determining the angular position in accordance with said predefined function of these at least two magnetic field components.

Preferably the magnetic field components are oriented in orthogonal directions.

The two magnetic field components are preferably measured at substantially the same physical location (in practice the locations may be slightly offset because of the physical dimensions of the sensor elements, but these are practically considered the same sensor location). See examples in the description using formula [3] or [4] or [10] or [13] or [14].

In an embodiment, the magnetic structure is a ring magnet having an inner radius (Ri) and an outer radius (Ro); and the sensor device has a plurality of sensor elements configured for measuring at least one magnetic field component (e.g. Bx) in a tangential direction and for measuring at least one magnetic field component (e.g. Bz) in a direction parallel to the rotation axis; and the processing circuit is configured for determining said angular position in accordance with said predefined function of these magnetic field components (e.g. Bx, Bz); and the sensor device is located such that a magnetic centre of the sensor elements is located at a distance (Rs) from the rotation axis larger than the inner radius (Ri) and smaller than the outer radius (Ro), and at a predefined distance (g) from a surface of the magnetic structure; and the plurality of grooves are located on a planar surface of the magnet, and are radially oriented.

With "tangential direction" or "circular direction" is meant tangential to an imaginary circle having radius Rs, the circle having a center on the rotation axis.

In an embodiment, the sensor device is located such that a magnetic centre of the sensor elements is located at a distance (Rs) in the range from Ri+(Ro−Ri)*30% and Ri+(Ro−Ri)*70%, or in the range from Ri+(Ro−Ri)*40% and Ri+(Ro−Ri)*60%.

In an embodiment (see for example FIGS. 5(a) to 5(d)), the magnetic structure is a ring magnet or disk magnet having an outer radius (Ro); and the sensor device has a plurality of sensor elements configured for measuring at least one magnetic field component (e.g. Bx) oriented in a tangential direction (X) and for measuring at least one magnetic field component (e.g. Bz) in a radial direction of the magnet; and the processing circuit is configured for determining said angular position in accordance with said predefined function of these magnetic field components; and the sensor device is located such that a magnetic centre of the sensor elements are substantially located at a distance (Rs) from the rotation axis larger than outer radius (Ro) and at an axial position substantially halfway between a bottom surface and a top surface of the ring magnet or disk magnet; and the plurality of grooves are applied to a cylindrical surface of the magnet, and are axially oriented.

In an embodiment, the sensor device is configured for measuring at least two magnetic field gradients (see for example FIG. 3: dBx/dx, dBz/dx, or FIG. 5: dBx/dx, dBy/dx); and the processing circuit is configured for determining the angular position in accordance with said predefined function of these at least two magnetic field gradients.

This embodiment offers the additional advantage of being robust against an external disturbance field.

In an embodiment (see for example FIGS. 3(a) to 3(f)), the magnetic structure is a ring magnet having an inner radius (Ri) and an outer radius (Ro); and the sensor device has a plurality of sensor elements configured for determining a spatial gradient (dBx/dx) of a magnetic field component (Bx) oriented in a tangential direction along said tangential direction (X), and for determining a spatial gradient (dBz/dx) of a magnetic field component (Bz) oriented in a direction (Z) parallel to the rotation axis along the tangential direction (X); and the processing circuit is configured for determining said angular position in accordance with said predefined function of these magnetic field gradients; and the sensor device is located such that a magnetic centre of the sensor elements is substantially located at a distance (Rs) from the rotation axis larger than the inner radius (Ri) and smaller than the outer radius (Ro), and at a predefined distance (g) from a surface of the magnetic structure; and the plurality of grooves are located on a planar surface of the magnet, and are radially oriented.

In an embodiment (see for example FIGS. 6(a) to 6(d)), the magnetic structure is a ring magnet or disk magnet having an outer radius (Ro); and the sensor device has a plurality of sensor elements configured for determining a spatial gradient (e.g. dBx/dx) of a magnetic field component (e.g. Bx) oriented in a tangential direction along said tangential direction (X), and for determining a spatial gradient (e.g. dBz/dx) of a magnetic field component (e.g. Bz) oriented in a radial direction of the magnet; and the processing circuit is configured for determining said angular position in accordance with said predefined function of these magnetic field gradients; and the sensor device is located such that a magnetic centre of the sensor elements is located at a distance (Rs) from the rotation axis larger than outer radius (Ro) and at an axial position substantially halfway between a bottom surface and a top surface of the ring magnet or disk magnet; and the plurality of grooves are applied to a cylindrical surface of the magnet, and are axially oriented.

In an embodiment, the sensor device is configured for measuring at least two second order magnetic field gradients; and the processing circuit is configured for determining the angular position in accordance with said predefined function of these at least two second order magnetic field gradients.

This embodiment offers the additional advantage of being highly robust against a constant external disturbance field, and against an external disturbance field generated by a conducting wire.

In an embodiment (similar to the mechanical arrangement of FIGS. 5(a) to 5(d)), the sensor device is configured for determining the second order gradient of Bx along the X-direction, and the second order gradient of By along the X-direction, and for calculating the angular position in accordance with the following formula: $\theta c = a\tan 2(d^2Bx/dx^2, d^2By/dx^2)$.

In an embodiment (similar to the mechanical arrangement of FIGS. 6(a) to 6(d)), the sensor device is configured for determining the second order gradient of Bx along the X-direction, and the second order gradient of Bz along the X-direction, and for calculating the angular position in accordance with the following formula: $\theta c = a\tan 2(d^2Bx/dx^2, d^2Bz/dx^2)$.

In an embodiment, the plurality of sensor elements comprises at least two sensor elements located at two different positions spaced apart from each other, configured for measuring at least two magnetic field components (e.g. H1, H2), oriented in parallel; and the processing circuit is configured for determining the angular position in accordance with said predefined function of these at least two magnetic field components.

In an embodiment, the plurality of sensor elements comprises at least three sensor elements located at three different positions spaced apart from each other, configured for measuring at least three magnetic field components (e.g. H1, H2, H3), oriented in parallel; and the processing circuit is configured for determining the angular position in accordance with said predefined function of these at least three magnetic field components.

In an embodiment, the three different locations are located on a straight line.

In an embodiment, the three different locations are located on an imaginary triangle. Preferably the three different locations are also located on an imaginary circle having a centre located on the rotation axis of the magnetic structure.

In an embodiment, the three different locations are spaced apart by half a pole distance.

In an embodiment, the three different locations are not spaced apart by half a pole distance but spaced apart by 10% to 45% or 55% to 90% of a pole distance.

In an embodiment, the processing circuit is configured for determining a first difference between a first pair of the three signals, and for determining a second difference between a second pair of these three signals, different from the first pair, and for determining the angular position in accordance with said predefined function of the first and second differences.

In an embodiment, the plurality of sensor elements are horizontal Hall elements.

In an embodiment, the plurality of sensor elements are vertical Hall elements or magneto-resistive elements, oriented in a direction tangential to an imaginary circle having a center on the rotation axis, on which circle at least one of the sensor elements is located.

In an embodiment, the processing circuit is configured for determining a difference between a first pair of the three signals, and for determining a linear combination of the three signals different from said difference, and for determining the angular position in accordance with said predefined function of said difference and said linear combination.

In an embodiment, the difference is determined as the second signal minus the first signal (signal2−signal1), and the linear combination is determined as two times the third signal minus the first signal minus the second signal (2*signal3−signal1−signal2).

In an embodiment, the plurality of sensor elements are horizontal Hall elements.

In an embodiment, the plurality of sensor elements are vertical Hall elements or magneto-resistive elements, oriented in a direction tangential to an imaginary circle having a center on the rotation axis, on which circle at least one of the sensor elements is located.

In an embodiment, the magnetic structure is a ring magnet or disk magnet having at least four poles, or at least six poles, or at least eight poles.

In an embodiment, the ring magnet or disk magnet is axially magnetized.

In an embodiment, the ring magnet or disk magnet is diametrically magnetized.

In preferred embodiments, the magnet has a plurality of axially or radially oriented grooves having a constant cross section, sized to reduce the angular position error to less than 1°, or to less than 0.5°, or to less than 0.2°, or to less than 0.1°.

In an embodiment, the magnetic structure comprises one or more materials selected from the group consisting of: AlNiCo, ferrite, SmCo, and NdFeB.

In an embodiment, the predefined function is an arctangent function of a ratio of two signals.

In an embodiment, the groove or grooves has/have a constant cross section.

In an embodiment, the groove or grooves has/have a shape and size which can be described by at most 15 parameters, or at most 12 parameters, or at most 10 parameters, or at most 8 parameters, or most 5 parameters, or at most 4 parameters, or at most 3 parameters, or at most 2 parameters, or by a single parameter.

In an embodiment, the groove or grooves has/have a shape selected from the group consisting of rectangle, square, trapezoidal, piece-wise-linear, polygonal, circular, elliptical, triangular, parabolic, or combinations of one or more of these.

According to a second aspect, the present invention provides a linear position sensor system, comprising: a multi-pole magnetic structure having an elongated shape, and having a plurality of magnetic poles for generating a magnetic field; a sensor device movable relative to the magnetic structure at a substantially constant distance from the magnetic structure, or vice versa; the sensor device comprising a plurality of sensor elements configured for measuring at least two magnetic field characteristics, and a processing circuit configured for determining a linear position of the sensor device relative to the magnetic structure in accordance with a predefined function of these at least two magnetic field characteristics; wherein said magnetic structure comprises one or more transverse grooves oriented in a transverse direction of said elongated shape (perpendicular to the relative direction of movement), and having a shape and size which can be described by a limited set of parameters, these parameters having values which are optimized so as to reduce a maximum error between the actual position of the sensor device relative to the magnetic structure and the position determined in accordance with said predefined function, by at least a factor of 2, or by at least a factor 3, or by at least a factor 4, or by at least a factor 5, or by at least a factor 8, or by at least a factor 10, or to minimize the maximum error.

In an embodiment, the magnetic structure has at most four magnetic poles (e.g. in the form of "only two teeth"). Such a magnetic structure could look like the "enlarged" portion of FIG. 4(a).

In an embodiment, the magnetic structure has only four magnetic poles and only one central groove located substantially in the middle of the magnetic structure (e.g. forming "two teeth"). The groove itself may have a cross-section comprising one or more cut-outs.

In an embodiment, the magnetic structure has at most six magnetic poles (e.g. in the form of "only three teeth").

In an embodiment, the magnetic structure has at least eight magnetic poles (e.g. in the form of at least four teeth).

In an embodiment, the sensor device is configured for measuring at least two magnetic field components (e.g. Bx, Bz) oriented in different directions; and the processing circuit is configured for determining the linear position in accordance with said predefined function of these at least two magnetic field components.

Preferably the magnetic field components are oriented in orthogonal directions.

The two magnetic field components are preferably measured at substantially the same physical location (in practice the locations may be slightly offset because of the physical dimensions of the sensor elements, but these are practically considered the same sensor location).

In an embodiment, the sensor device further comprises a semiconductor substrate; and the sensor device is configured for measuring a first magnetic field component (e.g. Bx) parallel to the semiconductor substrate and parallel to the direction of movement (e.g. X), and a second magnetic field component (e.g. Bz) perpendicular to the semiconductor substrate and perpendicular to the direction of movement (e.g. X); and the processing circuit is configured for determining the linear position in accordance with an arctangent function of a ratio of these magnetic field components (e.g. Bx, Bz).

In an embodiment, the sensor device further comprises a semiconductor substrate; and the sensor device is configured for measuring a first magnetic field gradient (e.g. dBx/dx) of a first magnetic field component (e.g. Bx) parallel to the semiconductor substrate along the direction of movement (e.g. X), and a second magnetic field gradient (e.g. dBz/dx) of a second magnetic field component (e.g. Bz) perpendicular to the semiconductor substrate along said direction of movement (e.g. X); and the processing circuit is configured for determining the linear position in accordance with an arctangent function of a ratio of these magnetic field gradients (e.g. dBx/dx, dBz/dx).

In an embodiment (see e.g. FIG. 4(*a*)), the sensor device is configured for determining at least two magnetic field gradients (e.g. dBx/dx, dBz/dx); and the processing circuit is configured for determining the linear position in accordance with said predefined function of these at least two magnetic field gradients.

In an embodiment, the plurality of sensor elements comprises at least two sensor elements located at two different positions spaced apart from each other, configured for measuring at least two magnetic field components (e.g. H1, H2), oriented in parallel, and wherein the processing circuit is configured for determining the linear position in accordance with a predefined function of these at least two magnetic field components.

In an embodiment, the plurality of sensor elements comprises at least three sensor elements located at three different positions spaced apart from each other, configured for measuring at least three magnetic field components (e.g. H1, H2, H3), oriented in parallel, and wherein the processing circuit is configured for determining the linear position in accordance with a predefined function of these at least three magnetic field components.

In an embodiment, the processing circuit is configured for determining a first difference between a first pair of the three signals, and for determining a second difference between a second pair of these three signals, different from the first pair, and for determining the angular position in accordance with a predefined function of the first and second differences.

In an embodiment (see e.g. FIG. 11 and FIG. 12), the sensor device comprises at least three sensor elements located at three different positions spaced apart from each other, configured for measuring at least three magnetic field components (H1, H2, H3), oriented in parallel; and the processing circuit is configured for determining the linear position in accordance with said predefined function of these at least three magnetic field components.

In an embodiment, the three different locations are located on a straight line.

In an embodiment, the three different locations are spaced apart by half a pole distance.

In an embodiment, the three different locations are not spaced apart by half a pole distance but spaced apart by 10% to 45% or 55% to 90% of a pole distance.

In an embodiment, the magnetic structure is an assembly of a plurality of discrete permanent magnets.

In an embodiment, the magnetic structure comprises a monolithic magnetic material which is magnetized so as to have multiple poles oriented in opposite directions.

In an embodiment, the magnetic structure has an elongated shape with a linear axis.

In an embodiment, the magnetic structure has an elongated shape with a curved axis.

In an embodiment, the remanent magnetic field (Brz) inside the magnetic material is oriented substantially perpendicular to said (linear or curved) axis.

The linear and angular position sensor system described above, especially when based on magnetic field gradients, of based on differences or linear combinations of signals, are ideally suited for use in automotive applications, e.g. a resolver application.

In an embodiment, the magnetic structure is primarily made of, or mainly comprises ferrite, SmCo, FeNdB.

In an embodiment, the magnetic structure comprises one or more materials selected from the group consisting of: AlNiCo, ferrite, SmCo, and NdFeB.

In an embodiment of the linear or angular position sensor system described above, the predefined function is an arctangent function of a ratio of two signals.

The predefined function may be in accordance with the formula $\theta = \arctan(v1/v2)$, The predefined function may be in accordance with the formula $\theta = a\tan2(v1/v2)$, The predefined function may be in accordance with the formula $\theta = \arctan(A*v1/v2)$, The predefined function may be in accordance with the formula $\theta = a\tan2(A*v1,v2)$, The predefined function may be in accordance with the formula $\theta = \arctan(v1/v2+B)$, The predefined function may be in accordance with the formula $\theta = \arctan(A*v1/v2+B)$, In each of these cases, v1 is the first signal, v2 is the second signal, and A and B are predefined constants, different from 0.

In an embodiment, the predefined function is implemented by means of a look-up table.

In an embodiment, the look-up table contains at most 48 angular values, or at most 36 angular values, or at most 24 angular values, to span a mechanical angular range from 0° to 360°.

In an embodiment, the groove has or the grooves have a constant cross section.

In an embodiment, the one or more grooves have a cross-section with a cut-out, the cut-out having a convex shape.

In an embodiment, the one or more grooves are axially oriented (as shown e.g. in FIGS. 5(*a*) to 5(*d*) and 6).

In an embodiment, the one or more grooves are are radially oriented.

In an embodiment, the one or more grooves have a shape and size which can be described by at most 15 parameters, or at most 12 parameters, or at most 10 parameters, or at most 8 parameters, or most 5 parameters, or at most 4 parameters, or at most 3 parameters, or at most 2 parameters, or by a single parameter.

In an embodiment, the one or more grooves have a shape selected from the group consisting of: rectangle, square, trapezoidal, piece-wise-linear, polygonal, circular, elliptical, triangular, parabolic, or combinations of one or more of these.

According to a third aspect, the present invention also provides an angular position sensor system (see e.g. FIG. 14 and FIG. 15) comprising: a magnetic structure for generating a magnetic field (e.g. an axially or diametrically magnetized two-pole bar magnet, or two-pole disk magnet, or two-pole ring magnet); and a sensor device movable relative to the magnetic structure about a rotation axis, or vice versa; the sensor device comprising a plurality of sensor elements configured for measuring at least two magnetic field characteristics, and a processing circuit configured for determining an angular position of the sensor device relative to the magnetic structure in accordance with a predefined function of these at least two magnetic field characteristics; wherein the sensor device is located such that a magnetic center of the sensor elements is located substantially on said rotation axis (e.g. at a distance of at most 1.4 mm, or at most 1.2 mm, or at most 1.0 mm, or at most 0.8 mm, or at most 0.6 mm, or at most 0.4 mm, or at most 0.2 mm from said axis); and said magnetic structure comprises one or more grooves having a shape and size which can be described by a limited set of parameters, these parameters having values which are optimized so as to reduce a maximum error between the actual angular position of the sensor device and the angular position determined in accordance with said predefined function, by at least a factor of 2, or by at least a factor 3, or by at least a factor 4, or by at least a factor 5, or by at least a factor 8, or by at least a factor 10, or to minimize the maximum error.

In an embodiment, the magnet has a rotation axis, and is rotatable around the rotation axis, and the sensor device is mounted substantially on said rotation axis.

In an embodiment, the sensor device is configured for determining two first order magnetic field gradients (dBz/dx, dBz/dy) of the axial magnetic field component (Bz) along two orthogonal directions (X, Y) perpendicular to the rotation axis, and the processing circuit is configured for determining the angular position in accordance with said predefined function of these first order magnetic field gradients, for example in accordance with the following formula: θc=arctan 2(dBz/dx, dBz/dy).

In an embodiment, the sensor device is configured for determining two second order magnetic field gradients ($d^2Bz/dx^2$, $d^2Bz/dy^2$) of the axial magnetic field component (Bz) along two orthogonal directions (X, Y) perpendicular to the rotation axis, and the processing circuit is configured for determining the angular position in accordance with said predefined function of these second order magnetic field gradients, for example in accordance with the following formula: θc=arctan 2($d^2Bz/dx^2$, $d^2Bz/dy^2$).

In an embodiment, the sensor device is configured for determining two second order magnetic field gradients ($d^2Bx/dx^2$, $d^2By/dy^2$) of two magnetic field components (Bx, By) oriented in orthogonal directions (X, Y) in a plane perpendicular to the rotation axis, the second order spatial derivative being determined along its respective axis (X, Y), and the processing circuit is configured for determining the angular position in accordance with said predefined function of these second order magnetic field gradients, for example in accordance with the following formula: θc=arctan 2($d^2Bx/dx^2$, $d^2By/dy^2$).

In an embodiment, the magnetic structure comprises one or more materials selected from the group consisting of: AlNiCo, ferrite, SmCo, and NdFeB.

In an embodiment, the predefined function is an arctangent function of a ratio of two signals.

In an embodiment, the groove or grooves has/have a constant cross section.

In an embodiment, the groove or grooves has/have a shape and size which can be described by at most 15 parameters, or at most 12 parameters, or at most 10 parameters, or at most 8 parameters, or most 5 parameters, or at most 4 parameters, or at most 3 parameters, or at most 2 parameters, or by a single parameter.

In an embodiment, the groove or grooves has/have a shape selected from the group consisting of: rectangle, square, trapezoidal, piece-wise-linear, polygonal, circular, elliptical, triangular, parabolic, or combinations of one or more of these.

Particular and preferred aspects of the invention are set out in the accompanying independent and dependent claims.

These and other aspects of the invention will be apparent from and elucidated with reference to the embodiment(s) described hereinafter.

BRIEF DESCRIPTION OF THE DRAWINGS

FIG. 3(a) to FIG. 3(c) shows mechanical aspects of the embodiment. FIG. 3(d) shows a graph illustrating the angular error reduction. FIG. 3(e) and FIG. 3(f) show simulated waveforms as can be measured by the sensor device for a magnet with and without grooves.

FIGS. 4(a) to 4(f) show an exemplary linear position sensor system according to an embodiment of the present invention. FIG. 4(a) shows the system in side view. FIG. 4(b) shows the system in front view. FIG. 4(c) shows a table with given and optimized parameters of the grooves, FIG. 4(d) shows formulas which can be used to calculate the linear position, FIGS. 4(e) and 4(f) show simulated waveforms as can be measured by the sensor device for a magnetic structure with and without grooves.

FIGS. 13(a) to 13(c) show an angular position sensor system known in the art.

FIGS. 17(a) to 17(f) show a few examples of groove cross sections, which can be described by a limited number of parameters, as can be used in embodiments of the present invention.

Figure 1A:
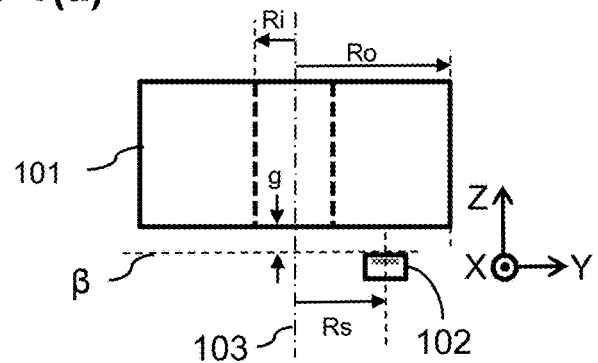
FIGS. 1(a) to 1(c) shows an exemplary angular position sensor system comprising an eight-pole ring magnet, and a sensor device using an arctangent function of a ratio of magnetic field gradients.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In this document, the term arctan function or a tan 2 function refer to an arctangent function. The reader not familiar with the a tan 2 function (or "2-argument arctangent" function) may for example refer to https://en.wikipedia.org/wiki/Atan2 for more information. Both notations are used in the present invention.

In this document, unless explicitly mentioned otherwise, the term "magnetic sensor device" or "sensor device" refers to a semiconductor device comprising at least one magnetic "sensor element", for example a Hall element or a magneto-resistive element. The sensor device comprises a semiconductor substrate. This substrate defines a "sensor plane".

Unless specifically mentioned otherwise, the drawings are shown with an orthogonal coordinate system fixedly connected to the sensor device, and oriented such that the XY plane corresponds to the substrate containing the sensitive elements, hence the Z-axis is oriented perpendicular to the substrate. When mounted relative to a magnetic structure, the sensor device is typically oriented such that the X-axis of the sensor device is tangential to the relative direction of movement.

In this document, the expression "in-plane components of a vector" and "projection of the field component in the sensor plane" mean the same. In this document reference is sometimes made to two (orthogonal) in-plane field components, Bx and By. Unless otherwise noted, Bx is oriented in the direction of relative movement of the sensor device and the magnetic structure.

In this document, the expression "out-of-plane component of a vector" and "Z component of the vector" and "projection of the field component on an axis perpendicular to the sensor plane" mean the same. This component is typically referred to herein as the Bz component.

In this document, the expression "spatial derivative" or "derivative" or "spatial gradient" or "gradient" are used as synonyms, unless clear from the context that something else was meant. Unless explicitly mentioned otherwise, the gradient is determined along the X-direction (e.g. dBx/dx or dBy/dx or dBz/dx), except for example in FIG. 14 and FIG. 15.

In the context of the present invention, the formulas arctan(x/y), a tan 2(x,y), arccot(y/x) are considered to be equivalent.

In the context of the present invention, the formulas arctan(A*x+B) and arctan(x/C-T) are considered to be equivalent, provided that the value of A=1/C, and the value of B=-T.

In the context of the present invention, as an example, the set of four formulas: signal1=H1−H2; signal2=H3−H2; ratio=signal1/signal2; angle=arctan(ratio); is considered equivalent to the formula: angle=arctan[(H1−H2/(H3−H2)].

In this document, the expression "spatial derivative" or "spatial gradient" means the same.

The present invention relates to position sensor systems comprising a magnetic structure and a sensor device movable relative to the magnetic structure, or vice versa. For example, in angular position sensor systems, a permanent ring or disk magnet may be rotatable about a rotation axis, and the sensor device may be mounted to a frame, at a predefined distance from said magnet.

Figure 1B:
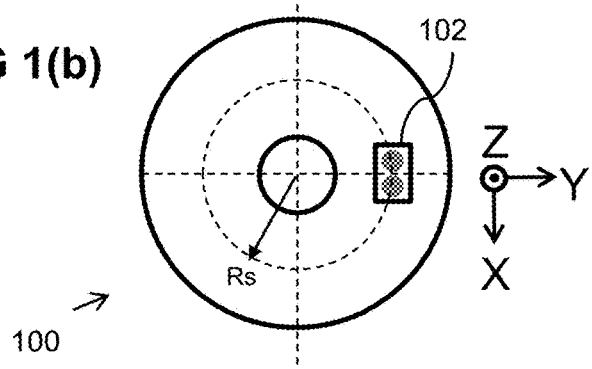
Figure 1C:
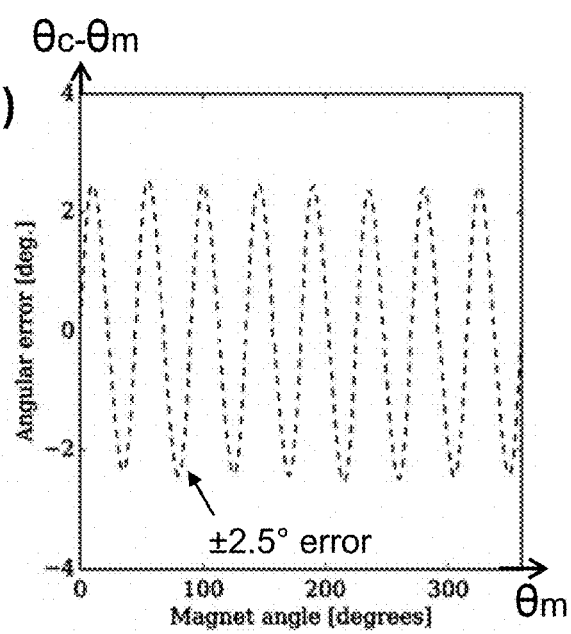

FIGS. 1(a) to 1(c) shows an exemplary angular position sensor system 100 comprising an eight-pole ring magnet having an inner radius Ri, and an outer radius Ro, and which is rotatable about a rotation axis 103. The magnet 101 may for example be axially magnetised or diametrically magnetised and may consist of or comprise ferrite material.

The sensor device 102 is arranged such that its sensitive elements (represented in this example by two discs) is located at an axial distance "g" (gap distance) from the bottom surface or top surface of the magnet, and such that the sensitive elements are located at a non-zero radial distance Rs from the rotation axis 103 (referred to herein as "off-axis position"). Preferably, this radial distance RS is at least 1.6 mm, or at least 1.8 mm, or at least 2 mm, or at least 2.5 mm, or at least 3 mm, or at least 4 mm, or at least 5 mm. In embodiments, the radial distance Rs is located between the inner radius Ri and the outer radius Ro, for example substantially halfway between Ri and Ro.

In the embodiment of FIGS. 1(a) to 1(c), the sensor device 102 is configured for measuring an in plane magnetic field gradient dBx/dx and an out-of-plane magnetic field gradient dBz/dx, and for determining the angular position based on a predefined function of these gradients, e.g. based on an arctangent function of a ratio of these gradients, e.g. in accordance with the formula $$\theta c = \arctan[(dBx/dx)/(dBz/dx)] \quad [1],$$

or in accordance with the formula:

$$\theta c = \arctan[K^*(dBx/dx)/(dBz/dx)] \quad [2]$$

where θc is the calculated angular position; K is a predefined constant, which may be different from 1.0 in case the amplitude of the in-plane magnetic field component Bx is different from the amplitude of the out-of-plane magnetic field component Bz measured by the sensor device.

As stated above, unless specifically mentioned otherwise, the drawings are shown with an orthogonal coordinate system connected to the sensor device, oriented such that the XY plane corresponds to the substrate containing the sensitive elements, the Z-axis is perpendicular to the substrate, and such that the X-axis is tangential to the relative direction of movement, which in the example of FIGS. 1(a) to 1(c) means, tangential to a circle with radius Rs. The magnetic field components Bx, By are referred to as "in-plane" magnetic field components because they are oriented parallel to the XY plane. The magnetic field component Bz is referred to as "out-of-plane" magnetic field component, because it is oriented in a direction perpendicular to the XY plane.

Figure 2A:
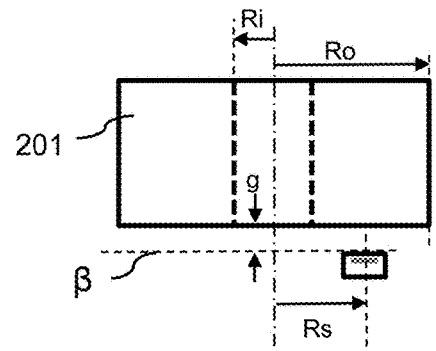
FIGS. 2(a) and 2(b) show an exemplary angular position sensor system comprising an eight-pole ring magnet, and a sensor device using an arctangent function of a ratio of magnetic field components.
Figure 2B:
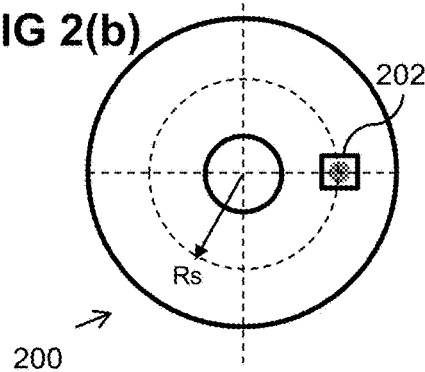

Such a sensor system is described in more detail in co-pending patent application No. EP19193068.4, filed on 22 Aug. 2019, which document is incorporated herein by reference in its entirety. In order to understand the present invention, it suffices to know that the signal Bx measured by the sensor device in such a configuration varies substantially like a sine-function of the angular position, and the signal Bz varies substantially like a cosine function of the angular position, and thus the angular position can be calculated as an arctangent function of their ratio (as shown in FIGS. 2(a) and 2(b)). Thus, such a sensor device needs to be able to measure a Bx value and a Bz value. Several implementations are possible, for example using horizontal Hall elements with integrated magnetic concentrators (IMC), or using a horizontal Hall element and a vertical Hall element, or using a horizontal Hall element and a magneto-resistive element (e.g. XMR or GMR), or using combinations hereof.

In the embodiment of FIGS. 1(a) to 1(c), the Bx and Bz component are measured at two different positions, spaced apart in the X-direction, from which values an in-plane gradient dBx/dx and an out-of-plane gradient dBz/dx can be calculated. The angular position of the sensor device relative to the magnet can then be calculated as an arctangent function of a ratio of these magnetic field gradients, which offers the major advantage that such a measurement is highly insensitive to an external disturbance field.

When evaluating a system where the sensor device was mounted at a distance of about 2 mm, the formula [1] and [2] mentioned above resulted in a position error, meaning: a difference between the actual mechanical position (denoted herein as θm) and the calculated angular position provided by the formula (denoted herein as θc). While such position error can be corrected by so called "post-processing" and/or by using a larger lookup table, this would require a larger memory and/or more processing time and/or more processing power and/or a more extensive calibration test, which is undesirable.

Confronted with the problem of improving the accuracy of the position sensor system, the inventors came to the creative idea of addressing the problem by providing a magnet with a plurality of grooves. It could not have been predicted that a magnet with grooves could improve the accuracy of the angular position sensor, let alone to what degree. Not knowing what the outcome would be, the inventors started simulations with a plurality of grooves having a single rectangular cut-out, and grooves having two rectangular cut-outs, and they optimized the dimensions of the grooves. As shown in FIGS. 3(a) to 3(f), eight radial grooves were applied, located at the transitions between North and South pole zones. It was found that there is some improvement when using an optimal groove with a single rectangular cut-out, but the results for an optimal groove with two rectangular cut-outs were simply amazing: by adding eight grooves with two rectangular cut-outs having optimal (or close-to-optimal) dimensions, the position error could be reduced from about ±2.5° to ±0.1°, which is almost unbelievable. This is one of the underlying principles of the present invention. The simulations also showed that a third groove did not provide much improvement.

In the rest of this document, other exemplary embodiments will be described, for example:
  a) an angular position sensor system comprising a ring or disk magnet, preferably having at least four poles, and a sensor device mounted in a so called "off-axis position" (see for example FIGS. 3(a) to 3(f), FIGS. 7(a) to 7(e) to FIGS. 10(a) and 10 (b));
  b) a linear position sensor system comprising a magnetic structure having at least two pole pairs (e.g. only the two "teeth" shown in the enlarged portion of FIG. 4(a) or a plurality of at least three pole pairs (see e.g. FIG. 4(a), FIG. 11 to FIG. 12), and a sensor device movable relative to said magnetic structure along a linear or curved trajectory);
  c) an angular position sensor system comprising a ring or disk magnet, having at least two poles, but preferably having at least four poles, and a sensor device mounted in a so called "through-shaft position" (see for example FIGS. 5(a) to 5(d) to FIGS. 6(a) to 6(d));
  d) an angular position sensor system comprising a magnet (e.g. bar magnet, cubic magnet, ring magnet, disk magnet) having only two poles, and a sensor device mounted in a so called "on-axis position" (see for example FIG. 14 to FIG. 15);
    but of course the present invention is not limited to these specific examples, but also works for other linear or angular position sensor system comprising a magnetic structure or a magnet having two or more poles and having one or more grooves which are optimized, or sub-optimized, as described herein, especially embodiments where the sensor device provides a linear or angular position as a function of two sinusoidal signals of approximately equal amplitude and approximately 90° phase shifted (known as "quadrature signals").

It is explicitly pointed out, however, that the principles of the present invention not only work for position sensors using "quadrature signals", but also works if the position is calculated as a function of two signals which have a substantially sinusoidal waveform, but with different amplitudes (e.g. having a ratio in the range from 0.5 to 0.90 or from 1.1 to 2.0) and/or having a phase shift different from 90° (e.g. in the range from 30° to 80° or in the range from 100° to 150°), as will become clear by the illustrative examples (e.g. FIGS. 8(a) to 8(d) and FIG. 12).

Referring now to the Figures.

FIGS. 1(a) to 1(c) and FIGS. 2(a) and 2(b) are already discussed above, and show an exemplary angular position sensor system comprising an eight-pole ring magnet, and a sensor device using an arctangent function of a ratio of magnetic field gradients (FIGS. 1(a) to 1(c)) or using an arctangent function of a ratio of magnetic field components (FIGS. 2(a) and 2(b)). The ring magnet does not contain grooves, and the intrinsic accuracy of the positioning system is limited to an angular error of about ±2.5°. (with "intrinsic accuracy" is meant the accuracy obtained without post-processing, in this case: the error that would be obtained if the outcome of the arctangent function is used as such, without a correction term). Suitable sensor devices, in particular suitable sensor structures and related methods and/or formulas, are described in co-pending patent application No. EP19193068.4, filed on 22 Aug. 2019, by the same applicant, in particular FIG. 12 and FIGS. 13(a) to 13(c) thereof, and the corresponding text. In order to understand the present invention, it suffices to know that the signals Bx and Bz of FIGS. 2(a) and 2(b) very much resemble a sine and a cosine waveform, and are substantially 90° phase shifted, but depending on the relative position of the sensor device with respect to the magnet (e.g. gap distance "g" and radial offset "Rs"), the amplitude of Bx and Bz may be different. The angular position can be calculated in accordance with the following formula:

$$\theta c = \arctan(K*Bx/Bz) \qquad [3]$$

where K is a predefined constant, preferably chosen such that the amplitude of (K*Bx) is equal to the amplitude of Bz. This can also be written in the following way:

$$\theta c = a\tan 2(K*Bx, Bz) \qquad [4]$$

using the a tan 2-function. In practical implementations, the arctangent function may be implemented by means of an interpolated look-up table. Such a lookup-table may for example store at most 24 or 36 or 48 data couples, or (if the arguments are assumed to be equidistant) may for example store at most 24 or 36 or 48 data values.

Figure 3A:
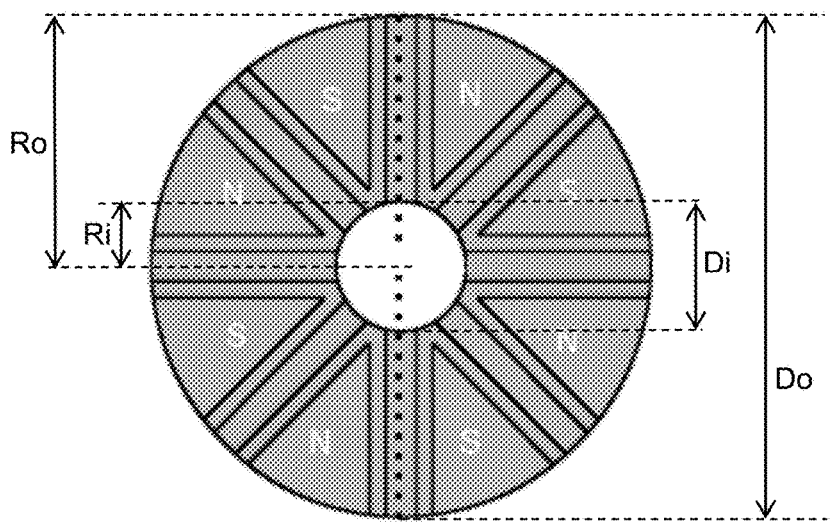
FIGS. 3(a) to 3(f) show an exemplary angular position sensor system according to an embodiment of the present invention.
Figure 3B:
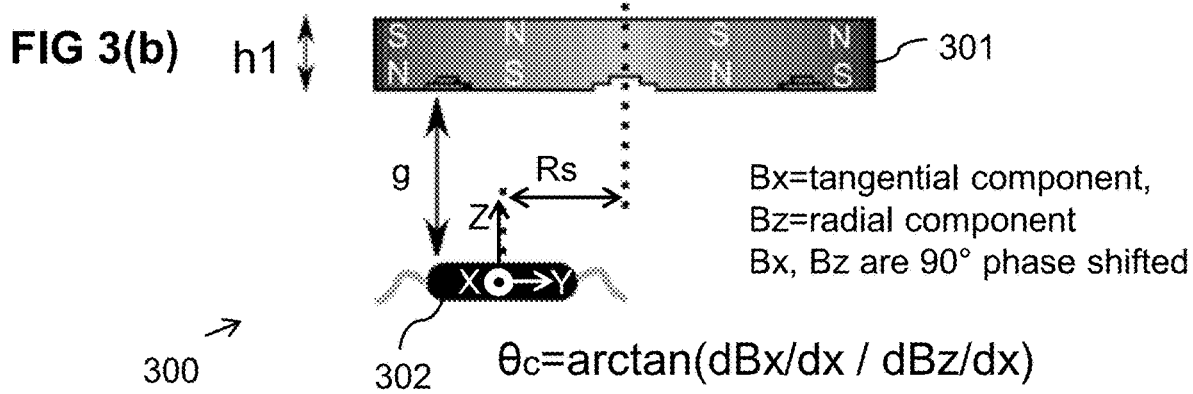
Figure 3C:
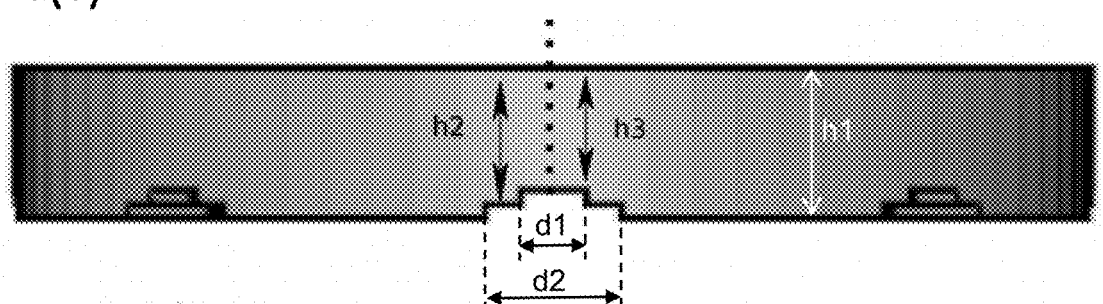

FIG. 3(b) shows an exemplary angular position sensor system 300 according to an embodiment of the present invention in front view, which can be seen as a modification of the sensor system of FIGS. 1(a) to 1(c) or FIGS. 2(a) and 2(b), namely, by adding eight radially oriented grooves, each groove in this example, having a constant cross section with two rectangular cut-outs. FIG. 3(a) shows a top view of the magnet. FIG. 3(c) shows a side view of the magnet. As can be seen in FIG. 3(b), this magnet is axially magnetised, and has eight pole pairs. As can be seen in FIG. 3(a) the sensor device will "see" eight poles (four north poles and four south poles). The ring magnet has eight grooves. If the magnet would be a disk magnet, the grooves may extend from one side of the magnet to the other side, and thus there would be only four grooves.

FIG. 3(c) shows the magnet with grooves in side view. The dimensions of the optimized grooves are indicated in the table. In this particular example, the height "h1" and the inner diameter "Di" and the outer diameter "Do" were given, as well as the relative (target) position of the sensor device: axial distance "g"=2.0 mm and radial offset "Rs"=6.0 mm, and the dimensions of the two rectangular cut-outs were optimised for this mechanical configuration, and taking into account the function used by the sensor device to calculate the angular position. As can be seen, for the particular position sensor system 300, the optimized groove has a first rectangular cut-out having a width d2=2.9 mm and a depth (h1−h2) of 0.3 mm, and has a second rectangular cut-out having a width d1=1.4 mm and a depth (h2−h3) of another 0.3 mm (thus 0.6 mm in total), but of course, this is only an example. As can be appreciated by those skilled person, if other boundary conditions are imposed (e.g. another g, Rs, Ro, Ri, h1, function), other optimized values may be obtained. The simulation was performed assuming a ferrite magnet, but other materials may also be used.

The following (brute force) algorithm can be used to find an optimum set of parameters for a magnet and sensor combination in an off-axis arrangement:

a) select a groove shape which can be described by a limited set of parameters;

For example, by at most 10 numbers, or at most 8, or at most 6, or at most 5, or at most 4, or at most 3, or at most 2, or a single parameter. Examples of possible groove shapes are shown in FIGS. 17(a) to 17(f), for example grooves having 1 rectangular cut-out, or having 2 rectangular cut-outs, or having a trapezoidal cut-out, or having a piece-wise-linear cut-out, or having a polygonal cut-out, or having a circular cut-out, or having an elliptical cut-out, or having a triangular cut-out, but the present invention is not limited to these particular shapes, and other shapes may also be used.

b) define a range and step for each parameter, and make a file or list or array of all candidate sets of parameter values to be simulated;

c) For each of these candidate sets of parameter values,
  i) model the multipole magnet with the groove in CAD software;
  ii) simulate the magnetic flux generated by this magnet,
  iii) determine the magnetic field components (e.g. Bx, Bz) and/or the magnetic field gradients (e.g. dBx/dx, dBz/dx) which are used by the sensor device for points in 3D space located on an imaginary circle located at a predefined axial offset "g" and having a radius "Rs", e.g. over a full stroke of 360°, in steps of for example 1°,
  iv) for each of the points on the imaginary circle of step iii),
    calculate the angle value that would be provided by the processing circuit of the sensor device using the predefined function and the simulated magnetic field values, and
    calculate an error as the difference between the mechanical position of said point, and the calculated angular position as would be provided by the sensor device,
  v) determine the maximum error for all the points on the imaginary circle of step iii),
  vi) store the maximum error for this parameter set in said file or list or array;

d) repeat step c) until the full parameter space has been simulated;

e) find the parameter set with the lowest maximum error, and provide the parameter values of this parameter set as the optimal groove parameters.

But of course, other algorithms or improvements of this algorithm can also be used.

For example, instead of simulating the full parameter space in step d), the loop can stop as soon as the maximum error for a particular parameter set is lower than a predefined threshold value, probably resulting in a sub-optimal solution, but still an optimized parameter-set.

As another example, instead of first defining (in step b) all possible parameter sets to be simulated, the algorithm may start from an initial set of parameter values, and stepwise improve the parameter set by modifying one parameter at the time, namely the parameter which (when increased or decreased with said predefined step) provides the highest improvement. In the case of two rectangular cut-outs, there are four parameters to be optimized, hence in each iteration, there are only 2^4=16 possibilities. It is pointed out that such a gradual improvement approach may not always find the "global optimum", but typically finds a "local optimum" in the parameter space.

Another approach is to perform the algorithm described above (step a to e) a first time using a relatively large range for each parameter and a coarse step (e.g. 0.3 mm) to find a rough estimate of the optimum parameter set, and then, to perform the algorithm described above (step a to e) a second time using a smaller range and a fine step (e.g. 0.1 mm).

It will be appreciated that describing the most efficient algorithm to find "the" optimum set of parameters falls out of the scope of the present invention. It is noted in this respect that also sub-optimal solutions reducing the (intrinsic) error by at least a factor 2, or at least a factor 3, or at least a factor 4, or at least a factor 5, or at least a factor 8, or at least a factor 10, provide a major improvement over existing solutions, and fall within the scope of protection of the present invention, as defined by the claims.

Figure 3D:
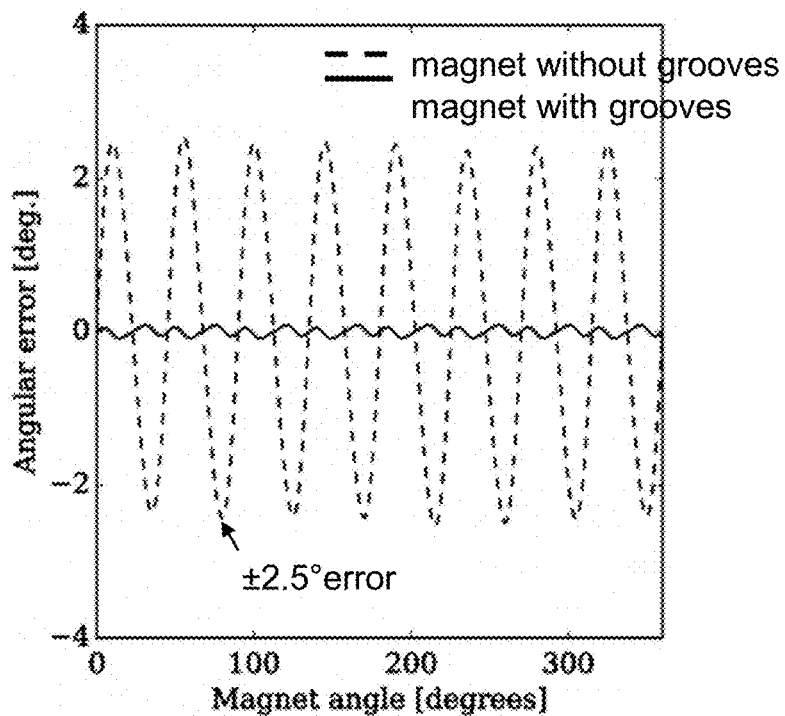

FIG. 3(d) shows a graph with two waveforms, a first waveform (in dotted line) showing the angular error (e.g. intrinsic error, without post-processing) for a magnet without grooves, having a maximum (or worst case) error of about ±2.5°, and a second waveform (in straight line) showing the angular error (e.g. intrinsic error, without post-processing) for the magnet with optimized grooves, having a maximum (or worst case) error of only about ±0.1°.

Figure 3E:
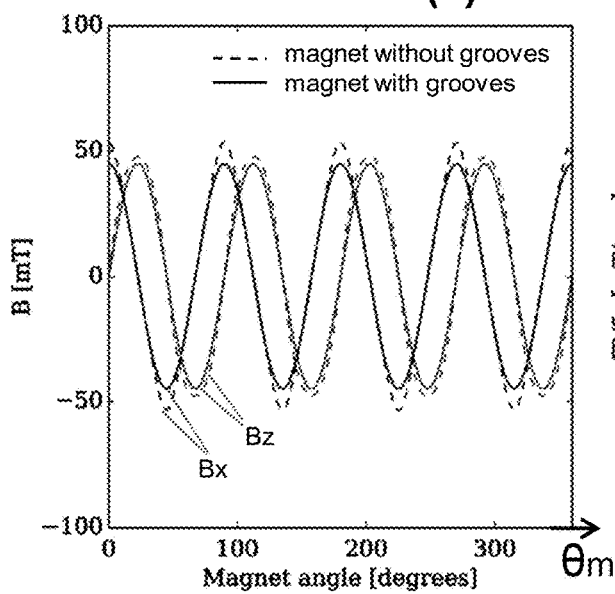

FIG. 3(e) shows waveforms of the magnetic field components Bx and Bz for points located on the above described imaginary circle, as simulated in the algorithm, and as would be measured by the sensor elements of a sensor device located at axial distance g=2 mm from the magnet surface, and at radial distance Rs=6 mm from the rotation axis, for a magnet with grooves having the optimized dimensions.

While the inventors do not wish to be bound by any theory, it appears that the grooves cause the Bx signal (tangential to said imaginary circle) and the Bz signal (oriented in the axial direction) to become more like a sine and a cosine function. It is noted, however, that the algorithm described above does not use a metric for "more sinusoidal", but simply calculates the error between the actual angular position of the sensor device, and the angle value provided by said function. It may thus well be that both signals deviate from a sine and cosine function, but that is irrelevant for the present invention, as long as the error is reduced. It is also noted that the grooves seem to be capable of changing the relative amplitude of the Bx and the Bz signal, thus a multiplication with a factor K in formula [3] or [4] may (in this case) be omitted.

Figure 3F:
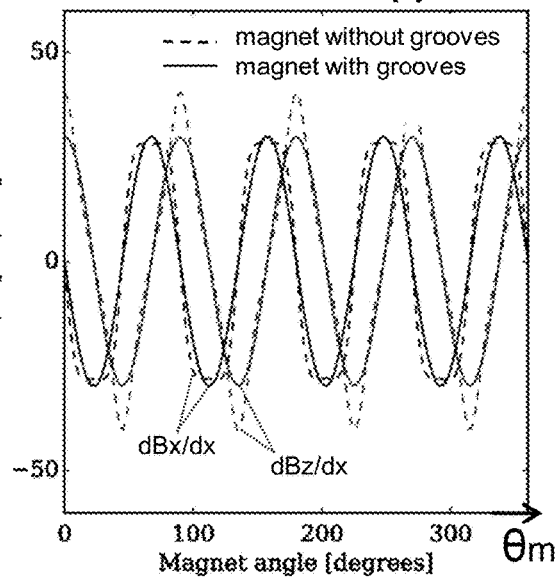

FIG. 3(f) shows the waveforms of the magnetic field gradients dBx/dx and dBz/dx for points located on the above described imaginary circle, as would be measured by the sensor elements of a sensor device located at axial distance g=2 mm from the magnet surface, and at radial distance Rs=6 mm from the rotation axis, for the magnet with grooves having the optimized dimensions.

As can be seen, it appears that the grooves also cause the dBx/dx signal and the dBz/dx signal to become more like a sine and a cosine function, but again, that is not a goal per se, as long as the maximum error is reduced.

Besides being an interesting observation, the waveforms of FIG. 3(e) and FIG. 3(f) demonstrate or at least make plausible also that the principles of the present invention will also work with other position sensor systems, in particular those using an arctangent function of two sinusoidal signals, which may or may not have the same amplitude and which may or may not be phase shifted by 90°, examples of which will be described further. It is contemplated that the same technical advantage, namely a reduction of the maximum position error provided by the arctangent function, will also be achieved here.

Thus, a magnet with optimized grooves as described above, can be used to considerably improve the accuracy of position sensor systems, without even having to change the post-processing circuitry. Alternatively, a magnet with optimized grooves can be used to only slightly improve the accuracy, or even to maintain the accuracy, but to reduce the post-processing circuitry and/or post-processing operations, or even to completely omit the post-processing circuitry. This may have a considerable cost impact, which should not be underestimated in high-volume products, such as in the automotive market.

While the example of FIGS. 3(a) to 3(f) shows a ring magnet having eight (axially oriented) pole pairs, the present invention is not limited thereto, and will also work with magnets having less than eight pole pairs, or having more than eight pole pairs, for example having only four pole pairs, or having only six pole pairs, or having ten pole pairs or even more than ten pole pairs.

While the example of FIGS. 3(a) to 3(f) shows a ring magnet 301 with two rectangular cut-outs, it shall be clear that other grooves which can be described by a limited set of parameters (e.g. at most 10 parameters) can also be used. FIGS. 16(a) to 16(h) show a few examples of groove cross sections, which can be described by a limited number of parameters, which can be used in embodiments of the present invention, the present invention not being limited to these examples.

Figure 16A:
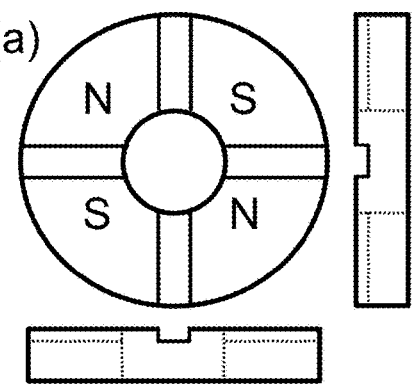
FIGS. 16(a) to 16(h) show a few examples of multi-pole ring magnets or disk magnets with radial and/or axial grooves, as may be used in embodiments of the present invention.
Figure 16B:
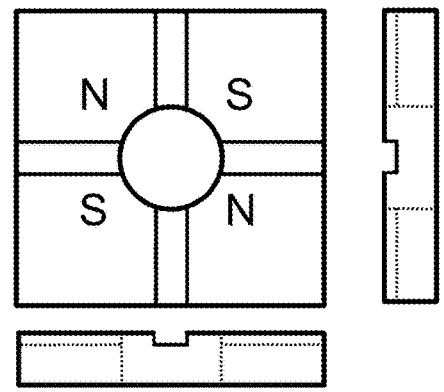
Figure 16C:
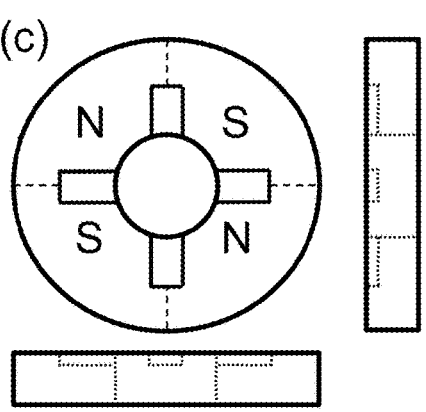
Figure 16D:
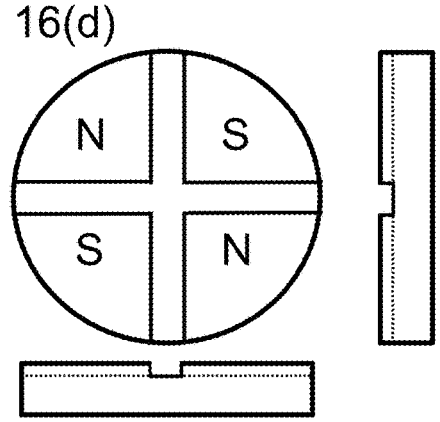
Figure 16E:
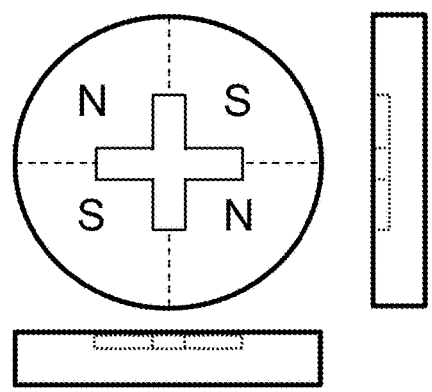
Figure 16F:
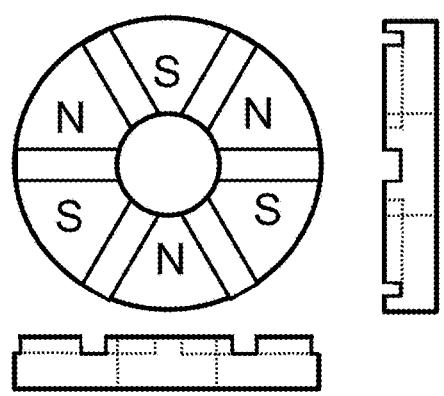

The system of FIGS. 3(a) to 3(f) is an example of an angular position sensor system comprising an eight pole ring magnet with a sensor device arranged in an off-axis position. In a variant of this system (not shown), the magnet is a disk magnet with grooves, see e.g. FIG. 16(a) showing a four-pole ring magnet with grooves, and FIG. 16(b) showing a four-pole disk magnet with grooves. The optimal groove-parameters may be different in both cases.

For completeness, a few methods are provided for producing such a magnet:

A first way of producing a magnet with groove(s) is by first making the ring magnet without grooves in known manners, and then providing the one or more grooves by mechanical machining, e.g. by grinding.

Another way of producing a magnet with groove(s) is by plastic bonding (plastic and magnetic particles are injected in a mold having a predefined shape so to form the magnet with the one or more grooves). These magnets are known as "bonded magnets" or "plastic bonded magnets". Such magnets are particularly beneficial for the present invention, because their mechanical strength is relatively high, their mechanical tolerances are quite low, and the magnet shape including the groove or grooves can be made simultaneously.

Another way of producing a magnet with groove(s) is by pressing magnetic powder to a particular shape, and then sintering said compressed shape.

The magnet can be made of any suitable material, for example Ferrite, FeNdB, SmCo, etc., but the present invention is not limited hereto.

In an embodiment, the magnet comprises one or more materials selected from the group consisting of: AlNiCo, ferrite, SmCo, and NdFeB.

So far, only angular position sensor systems are described, but the present invention is not limited thereto, and the same technique also works for linear position sensor systems, as will be described next.

FIGS. 4(a) to 4(f) show an exemplary linear position sensor system 400. The linear position sensor system 400 comprises: a multi-pole magnetic structure 401 having an elongated shape, and having a plurality of magnetic poles (e.g. at least two pole pairs) for generating a magnetic field, and a sensor device 402 movable relative to the magnetic structure 401 (or vice versa), at a substantially constant distance "g" from the magnetic structure, e.g. equal to about 2 mm, referred to herein as "air gap". The sensor device 402 comprises a plurality of sensor elements (not explicitly shown) for measuring at least two magnetic field components, e.g. Bx in an X-direction tangential to the relative direction of movement, and Bz in a direction Z perpendicular thereto, preferably parallel to the direction of the remanent magnetic field inside the magnet.

The sensor device 402 further comprises a processing circuit connected to said sensor elements and configured for determining a linear position (denoted herein as "x") of the sensor device 402 relative to said magnetic structure 401, which is calculated in accordance with a predefined function of these magnetic field components (e.g. Bx, Bz). Alternatively, the sensor device 402 comprises a plurality of sensor elements for measuring at least two magnetic field gradients (e.g. dBx/dx, dBz/dx) and a processing circuit configured for determining a linear position of the sensor device relative to said magnet structure in accordance with a predefined function of these magnetic field gradients.

The sensor device 402 may have a block-diagram similar to or identical to the block-diagram shown in FIGS. 6(a) to 6(d) of co-pending application EP18205705.9, filed by the same applicant on 12 Nov. 2018, incorporated herein by reference in its entirety, and may have a sensor structure as described in FIGS. 4(a) to 4(f) or FIGS. 5(a) to 5(d) thereof, but the present invention is not limited thereto, and other sensor devices may also be used, for example a sensor device having sensor elements as described in US20110291645A1, incorporated herein by reference in its entirety, in particular as shown in FIG. 2(a) or FIG. 2(c) thereof.

According to an important aspect of the present invention, the magnetic structure 401 comprises one or more transverse grooves (14) oriented in a transverse direction (Y) of said elongated shape, said one or more grooves having a shape and size which can be described by a limited set of parameters, the parameters having values which are optimized so as to reduce or minimize a maximum error between the actual position of the sensor device relative to the magnet and the position calculated in accordance with the predefined function used by the device, the maximum calculated over a predefined movement range.

Figure 4E:
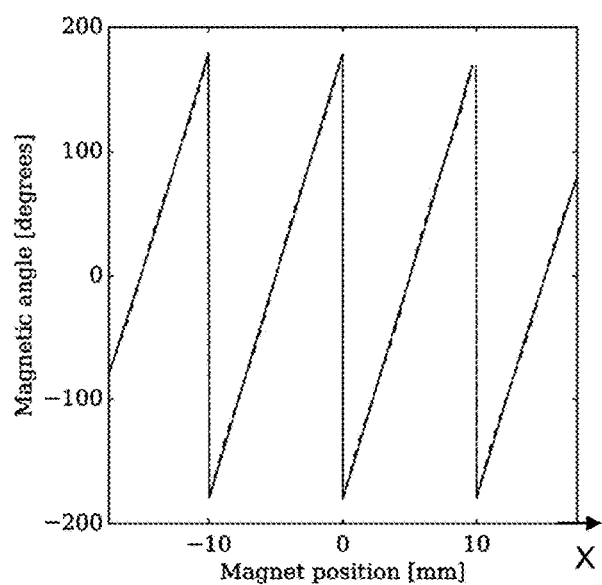

In the particular example shown in FIGS. 4(a) to 4(f) of the present invention, the magnetic structure 401 has a plurality of grooves, each groove having two rectangular cut-outs (e.g. as shown in FIG. 4(a)). In the example, the following function is used to determine the linear position X:

$$x = n^* L_T + K^* \theta c \quad [5]$$

where "n" represents the number of a tooth under which the sensor device 402 is located (which can for example be counted by the sensor device, or determined in another way), and $L_T$ represents the length of one tooth in the movement direction X, K is a predefined constant equal to $L_T/360°$, and θc is the calculated angular position, which (in the example) is determined as an arctangent function of two gradients, in accordance with the following formula:

$$\theta c = \arctan 2(dBx/dx, dBz/dx) \quad [6]$$

The following parameters or constraints were given:
gap distance g=2 mm,
the width W of the magnetic structure=8 mm,
the (total) length L of the magnetic structure=40 mm,
 (there are 8 teeth, each having a length $L_T$=5 mm);
the height H of the magnetic structure=3.5 mm,
shape of the grooves: two rectangular cut-outs,
and a set of optimal parameters was determined which minimizes the maximum error between the actual position of the sensor device 402 and the position provided by formula [5] and [6].

A variant of the algorithm described above can be used to find an optimized (or sub-optimized) parameter-set. The algorithm could be modified for example such that, instead of determining the error for each of a plurality of points located on said imaginary circle, now the linear position is calculated for a plurality of points along the X-axis (corresponding to various linear position of the sensor device), instead of a plurality of points on an imaginary circle.

FIG. 4(c) shows a table with the given and optimized parameters for this example. As can be seen, for the exemplary sensor system of FIGS. 4(a) to 4(f), the optimal grooves have a first rectangular cut-out having a width d2 of 1 mm and a depth of (H−h2)=0.35 mm, and a second rectangular cut-out having a width d1 of 0.5 mm and a depth of (h2−h1)=0.35 mm (or 0.7 mm in total).

It may be a mere coincidence that in both examples (FIGS. 3(a) to 3(f) and FIGS. 4(a) to 4(f)) the second rectangular cut-out has substantially the same depth as the first rectangular cut-out, and only half of its width. On the other hand, this may not be a coincidence, but an indication that a cut-out with a triangular cross section may provide an even a better result. In other words, a groove with two rectangular cut-outs having the parameter values shown in FIG. 4(c) may be the best solution for a groove with two rectangular cut-outs but may not be "the" optimum groove. Yet, because this groove reduces the maximum error by at least a factor of 2 (as will be described next), this groove is considered to be "optimized" or at least sub-optimized.

Figure 4F:
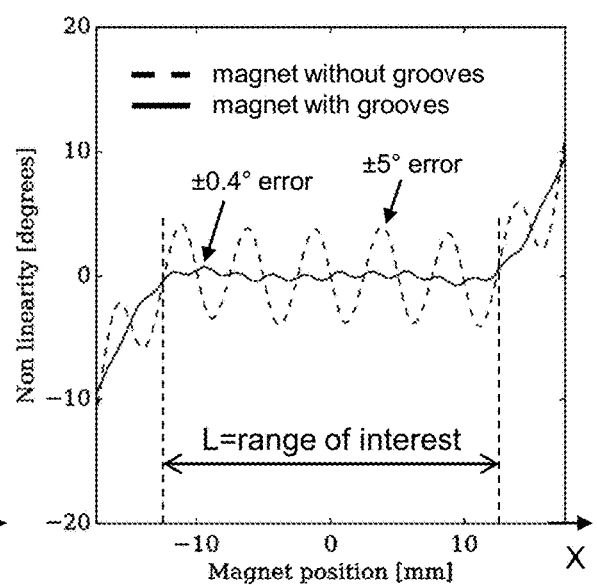
Figure 5A:
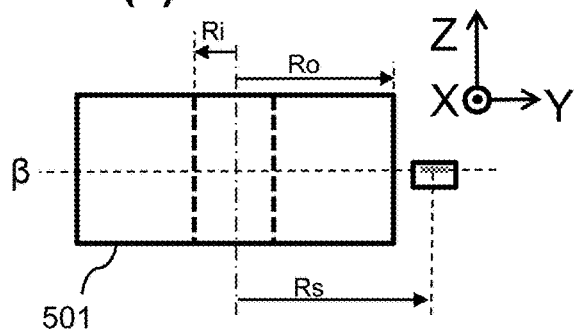
FIGS. 5(a) to 5(d) show another exemplary angular position sensor system according to an embodiment of the present invention, in which the magnet has axial grooves, and the sensor device has sensor elements for measuring two in-plane field components (Bx, By) or two in-plane field gradients (dBx/dx, dBy/dx).
Figure 5C:
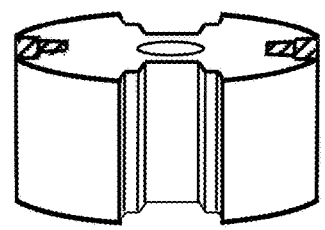
Figure 5B:
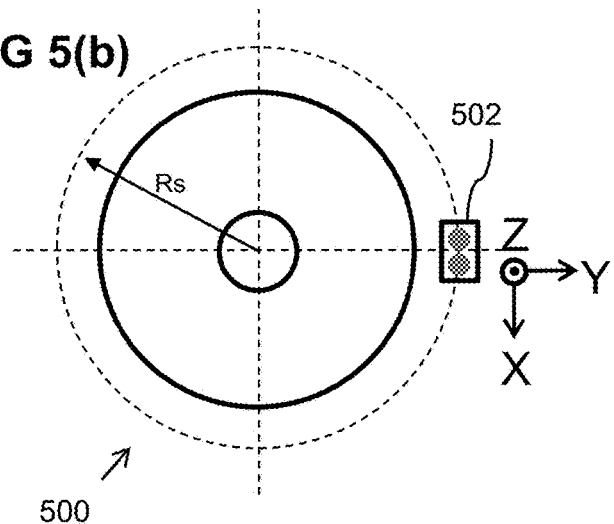
Figure 5D:
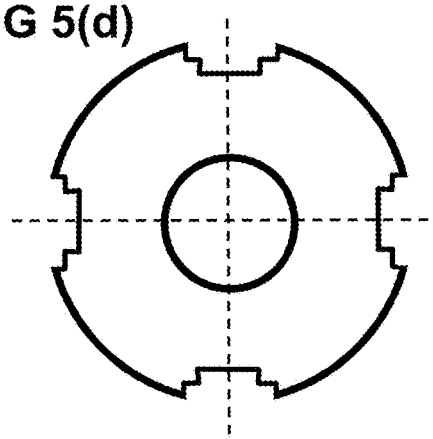
Figure 6A:
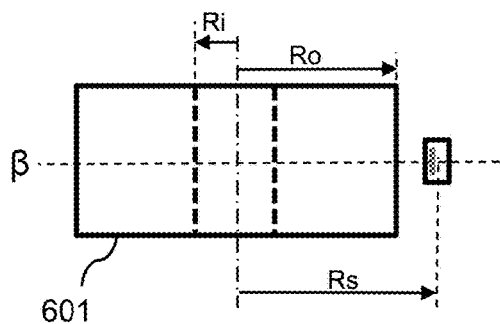
FIGS. 6(a) to 6(d) show another exemplary angular position sensor system according to an embodiment of the present invention, in which the magnet has axial grooves, and the sensor device has sensor elements for measuring one in-plane (Bx) and one out-of-plane (Bz) field component, or for measuring one in-plane gradient (dBx/dx) and one out-of-plane field gradient (dBz/dx).
Figure 6C:
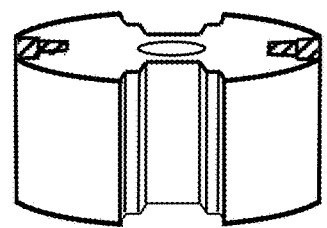
Figure 6B:
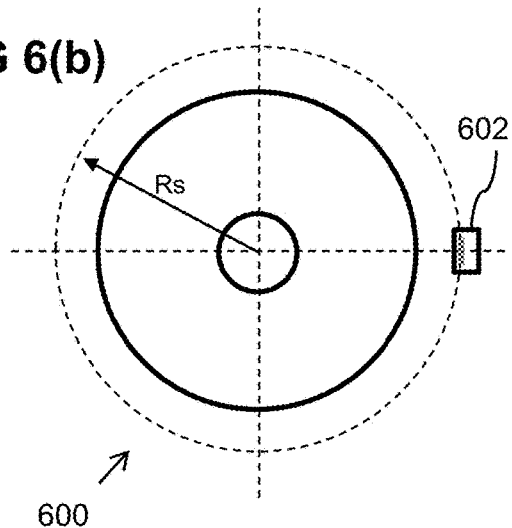
Figure 6D:
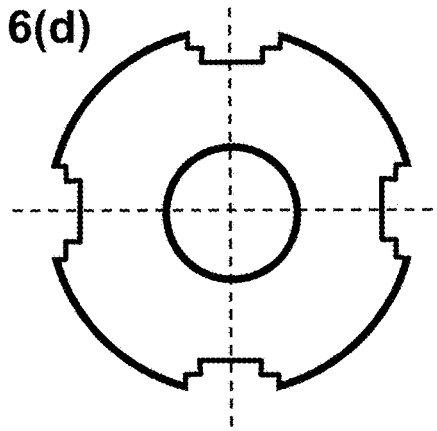

FIG. 4(e) and FIG. 4(f) show simulated waveforms as would be measured by the sensor device for a magnetic structure with grooves (full line) and without grooves (dotted line). As can be seen in FIG. 4(f), the maximum angular error provided by formula [6], causing a linear error in formula [5], amounts to about ±5°, whereas the maximum error for the magnetic structure with the optimized grooves is only about ±0.4°. That means a factor of about 12 improvement, which is truly amazing.

The magnetic structure shown in FIG. 4(a) can be produced in several ways, for example by making individual "teeth" having "stairs" or "steps" on either side, which, when located adjacent one another, form an elongated magnetic structure with the above described "grooves". The individual teeth may be held together in any known manner, e.g. by bonding, or by gluing.

But similar as described above, other ways of producing this magnetic structure are also possible, for example: (i) first making the magnetic structure without grooves in known manners, and then providing the grooves by machining, e.g. by grinding, (ii) by pressing and sintering magnetic powder, (iii) by plastic bonding, but the present invention is not limited hereto.

FIGS. 5(a) to 5(d) show another exemplary angular position sensor system 500, comprising a ring magnet 501 and a sensor device 502 located relative to the ring magnet such that a magnetic centre of the sensor elements of the sensor device 502 is located at a distance Rs from the rotation axis larger than outer radius Ro, and at an axial position substantially halfway between the top surface and bottom surface of the magnet 501. The magnet may be radially or diametrically or axially magnetized. The sensor device 502 has sensor elements for measuring two in-plane field gradients dBx/dx and dBy/dx, where the XY plane is parallel to the substrate of the sensor device, and the X-direction is tangential to an imaginary circle having a center on the rotation axis, the Y-direction is radial to the magnet, and the Z-direction is parallel to the rotation axis. The ring magnet 501 has an outer radius Ro. The sensor device 502 further comprises a processing circuit configured for determining an angular position in accordance with a predefined function of these magnetic field gradients, for example in accordance with the formula:

$$\theta c = \arctan 2(dBx/dx, dBy/dx) \quad [7]$$

Figures 14, 15:
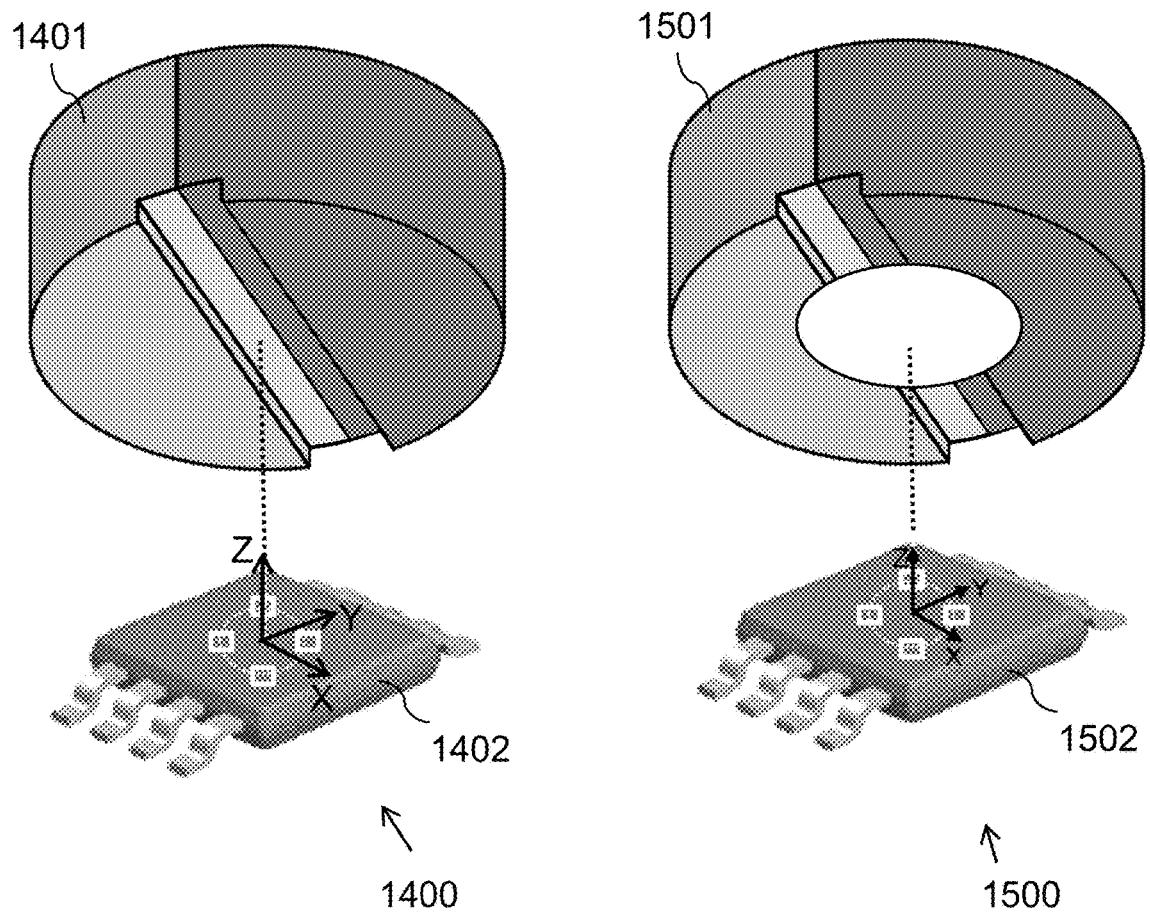
FIG. 14 shows a variant of the angular position sensor system of FIGS. 13(a) to 13(c), using a ring magnet, and wherein the magnet has a plurality of optimized grooves, according to an embodiment of the present invention.
FIG. 15 shows a variant of the angular position sensor system of FIG. 14, using a ring magnet rather than a disk magnet, according to an embodiment of the present invention.

Such a sensor device 500 is described in more detail in co-pending patent application EP19193068.4, filed by the same applicant on 22 Aug. 2019, in particular FIG. 14 thereof. In order to understand the present invention, it suffices to know that several sensor topologies can be used to determine the dBx/dx and dBy/dx signal (e.g. using horizontal Hall elements or vertical Hall elements or magneto-resistive elements), and that the signals dBx/dx and dBy/dx have a substantially sinusoidal waveform, and are substantially 90° phase shifted. If their amplitude is not substantially the same, the following formula may be used to calculate the angle:

$$\theta c = \arctan 2(K^* dBx/dx, dBy/dx) \quad [8]$$

where K is a predefined constant, which can be chosen during design or determined during calibration and stored in a non-volatile memory of the sensor device.

According to an aspect of the present invention, a plurality of grooves are applied to a cylindrical surface of the magnet, and are axially oriented. In the example shown, the grooves have a constant cross-section with two rectangular cut-outs, the dimensions of which can be optimized in a similar manner as described above, taking into account formula [7] or formula [8], but grooves with other shapes can also be used, for example as illustrated in FIGS. 17(a) to 17(f).

This embodiment has many desirable features, inter alia: highly insensitive to temperature effects and ageing effects (because a ratio of two signals is used), highly insensitive to an external disturbance field (because magnetic field gradients are used), highly accurate (because of the grooves which are optimized for the function being used).

In a variant (not shown) of the embodiment shown in FIGS. 5(a) to 5(d), the magnet is a disk magnet rather than a ring magnet.

In another or further variant (not shown) of the embodiment shown in FIGS. 5(a) to 5(d), the sensor device 502 does not calculate the angular position based on an arctangent function of the ratio of two magnetic field gradients, but based on an arctangent function of the ratio of two magnetic field components, for example in accordance with $$\theta c = \arctan 2(Bx, By) \quad [9]$$

if the amplitude of Bx and By is substantially the same, or in accordance with the following formula:

$$\theta c = \arctan 2(K*Bx, By) \quad [10]$$

if the amplitude of Bx and By is not substantially the same, where θc is the calculated angular position, and K is a predefined constant.

Such a system is not highly robust against an external disturbance field, which for some applications is not a problem. The grooves optimized for this system, using the function [9] or [10] may or may not be identical to the grooves optimized for the system shown in FIGS. 5(a) to 5(d), using the function [7] or [8]. It is contemplated that grooves optimized for formula [7] or [8] may be close-to-optimal for formulas [9] or [10]. As mentioned above, a sub-optimal groove is still a major improvement over prior art systems without a groove, especially in terms of accuracy. It is contemplated that the absolute angular accuracy of this system may be well below 1°.

In a variant, the sensor device is configured for determining a second order gradient of Bx along the X-direction, and a second order gradient of By along the X-direction, and for calculating the angular position in accordance with the following formula:

$$\theta c = a\tan 2(d^2 Bx/dx^2, d^2 By/dx^2) \quad [23]$$

Such a sensor device is described for example in more detail in FIG. 1(a) to FIG. 13(c) of EP19193074.2, filed by the same applicant on 22 Aug. 2019 incorporated herein by reference in its entirety, but the present invention is not limited thereto, and other sensor structures for determining said second order gradients can also be used. In addition to what is described in that application, the magnet further comprises a groove, having a shape and size which can be described by a limited number of parameters (e.g. at most 15 parameters, or at most 12, or at most 10, or at most 8, or at most 5, or at most 4, or at most 3), the values of which parameters can be optimized by performing simulations in a manner similar as described above, taking into account the sensor topology, and formula [23].

FIGS. 6(a) to 6(d) show another exemplary angular position sensor system 600, which can be seen as another variant of the system shown in FIGS. 5(a) to 5(d), where the sensor device 602 is rotated by 90° about its X-axis, the chip being oriented such that the X-axis is tangential to an imaginary circle having a center located on the rotation axis. The sensor device 602 has a plurality of sensor elements for measuring an in-plane magnetic field gradient dBx/dx and an out-of-plane magnetic field gradient dBz/dx. The sensor device 602 comprises a processing circuit configured for determining an angular position in accordance with a predefined function of these magnetic field gradients, for example in accordance with the formula:

$$\theta c = \arctan 2(dBx/dx, dBz/dx) \quad [11]$$

Such a sensor device 602 is described in more detail in co-pending patent application EP19193068.4, filed by the same applicant on 22 Aug. 2019, in particular FIG. 15 thereof. In order to understand the present invention, however, it suffices to know that the signals dBx/dx and dBz/dx have a substantially sinusoidal waveform, and are substantially 90° phase shifted. If their amplitude is not substantially the same, the following formula may be used to calculate the angle:

$$\theta c = \arctan 2(K*dBx/dx, dBz/dx) \quad [12]$$

where K is a predefined constant.

According to an aspect of the present invention, a plurality of grooves are applied to the cylindrical surface of the magnet, and are axially oriented. In the example shown, the grooves have a constant cross-section with two rectangular cut-outs, the dimensions of which can be optimized in a similar manner as described above, taking into account formula [11] or formula [12], but grooves with other shapes may also be used, for example as illustrated in FIGS. 17(a) to 17(f).

This embodiment has many desirable features, inter alia: highly insensitive to temperature effects and ageing effects (because a ratio of two signals is used), highly insensitive to an external disturbance field (because magnetic field gradients are used), highly accurate (because of the grooves which are optimized for the function being used).

In a variant of this embodiment, the magnet is a six-pole magnet, or an eight-pole magnet, or a magnet having more than eight poles.

In a variant (not shown) of the embodiment shown in FIGS. 6(a) to 6(d), the magnet 601 is a disk magnet rather than a ring magnet.

In another or further variant (not shown) of the embodiment shown in FIGS. 6(a) to 6(d), the sensor device 602 does not calculate the angular position based on an arctangent function of a ratio of two magnetic field gradients, but based on an arctangent function of a ratio of two magnetic field components, one in-plane field component Bx, and one out-of-plane field component Bz, for example in accordance with $$\theta c = \arctan 2(Bx, Bz) \quad [13]$$

if the amplitude of Bx and Bz is substantially the same, or in accordance with:

$$\theta c = \arctan 2(K*Bx, Bz) \quad [14]$$

if the amplitude of Bx and Bz is not substantially the same, where K is a predefined constant.

Such a system is not highly robust against an external disturbance field, which for some applications is not a problem. The grooves optimized for this system, using the function [13] or [14] may or may not be identical to the grooves optimized for the system shown in FIGS. 6(a) to 6(d), using the function [11] or [12]. It is contemplated that grooves optimized for formula [11] or [12] may be close-to-optimal for formulas [13] or [14]. A sub-optimal groove is still a major improvement over prior art systems without a groove, especially in terms of accuracy. It is contemplated that the absolute angular accuracy of this system may be well below 1°.

FIGS. 7(a) to 7(e) shows another exemplary angular position sensor system 700 comprising a multi-pole magnet 701 and a sensor device 702. This sensor device 702 comprises three horizontal Hall elements S1, S2, S3 for measuring three out-of-plane magnetic field components (e.g. Bz1, Bz2, Bz3) oriented in a direction Z parallel to the rotation axis, perpendicular to the semiconductor substrate of the sensor device 702. The three sensors S1, S2, S3 are located on a straight line X, and are spaced apart over half a pole distance, thus the three signals are substantially 90° phase shifted.

The sensor device 702 further comprises a processing circuit (not explicitly shown) configured for calculating a first difference signal D1 as the difference between the signals provided by sensor S1 and S2 respectively, and for calculating a second difference signal D2 as the difference between the signals provided by sensor S2 and S3 respectively, for example in accordance with the following formulas:

$$D1=H1-H2 \quad [15a]$$

$$D2=H3-H2 \quad [15b]$$

where D1, D2 is the first/second difference signal, and where H1, H2, H3 is the signal provided by first/second/third sensor S1, S2, S3 respectively.

Figure 7A:
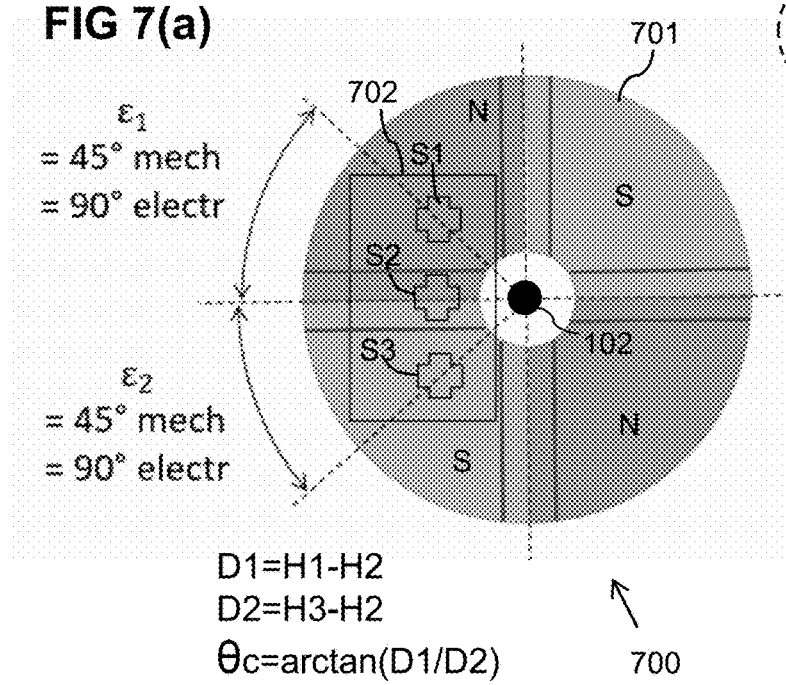
FIGS. 7(a) to 7(d) show another exemplary angular position sensor system according to an embodiment of the present invention, having a four-pole magnet with grooves, and having a sensor with three (e.g. only three) sensor elements spaced apart by half a pole distance (90° electrical), and using an arctangent function.
Figure 7B:
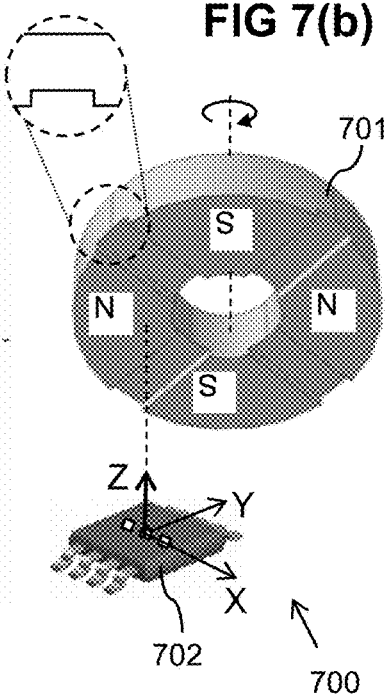
Figure 7C:
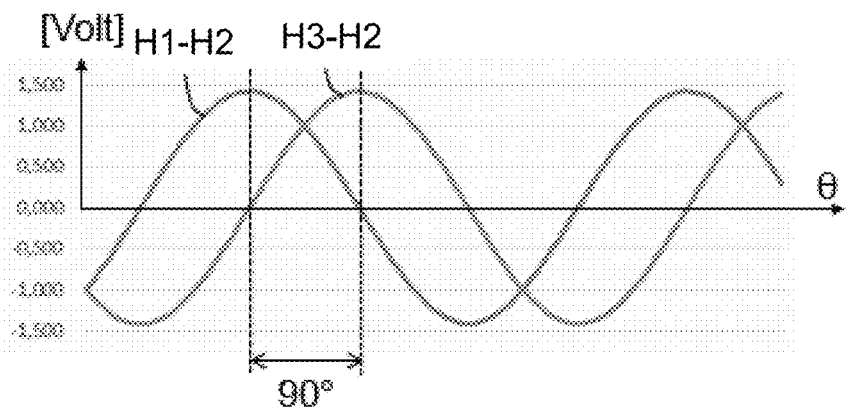

FIG. 7(c) shows that the difference signals D1, D2 have equal amplitude and are phase shifted by 90°, thus are quadrature signals.

Figure 7D:
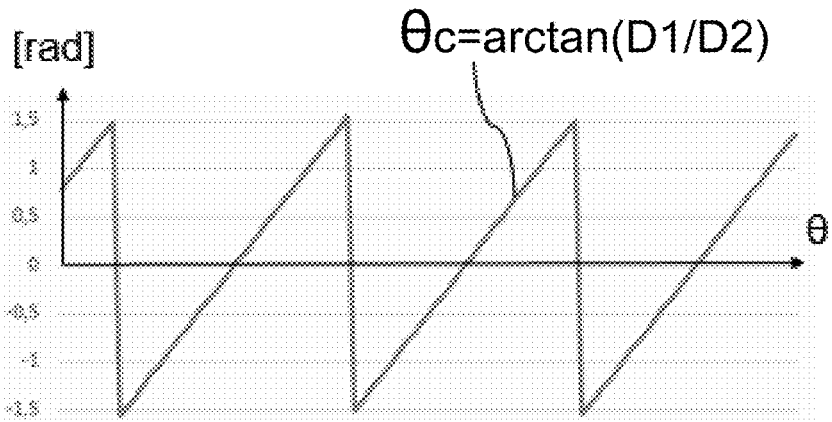

FIG. 7(d) shows that the angular position of the sensor device 702 relative to the magnet can be calculated by an arctangent function of a ratio of these difference signals, for example in accordance with the following formula:

$$\theta c = \arctan(D1/D2) \quad [15c]$$

Such a sensor device 702 is described in more detail in FIGS. 1(a) to 1(c) of co-pending patent application EP19175668.3 filed by the same applicant on 21 May 2019, incorporated herein by reference in its entirety.

In the example shown in FIGS. 7(a) to 7(e), the magnet 701 is a so called axially magnetized four-pole ring magnet, but a ring magnet with more than four poles can also be used. Alternatively, a disk magnet with at least four poles or at least six poles can also be used.

According to an aspect of the present invention, a plurality of radially oriented grooves are applied to the planar surface of the magnet 701. In the example shown, the grooves have a constant cross-section with one rectangular cut-out, the dimensions of which can be optimized in a similar manner as described above, taking into account formulas [15a-c], but grooves with other shapes can also be used, for example as illustrated in FIGS. 17(a) to 17(f). As indicated above, a groove having only one rectangular cut-out may not provide the best possible solution, but may still be capable of reducing the error between the actual angular position and the position indicated by formula [15c] by a least a factor two.

This position sensor system is insensitive to an external disturbance field, and the sensor device needs to be located at a radial distance Rs from the rotation axis at which the sensor elements S1, S2, S3 are spaced apart by half a pole distance, which is dependent on the dimensions of the magnet. Thus, in this embodiment, the magnet dimensions, and the dimensions of the grooves, and dimensions of the the sensor device, and the position of the sensor device are matched.

In a variant of this embodiment, the sensor elements are vertical Hall elements, or magneto-resistive elements (e.g. GMR or)(MIR elements), configured for measuring Vx1, Vx2, Vx3 oriented in the X-direction (on which the sensor elements are located), and D1=Vx1−Vx2, and D2=Vx3−Vx2.

Figure 7E:
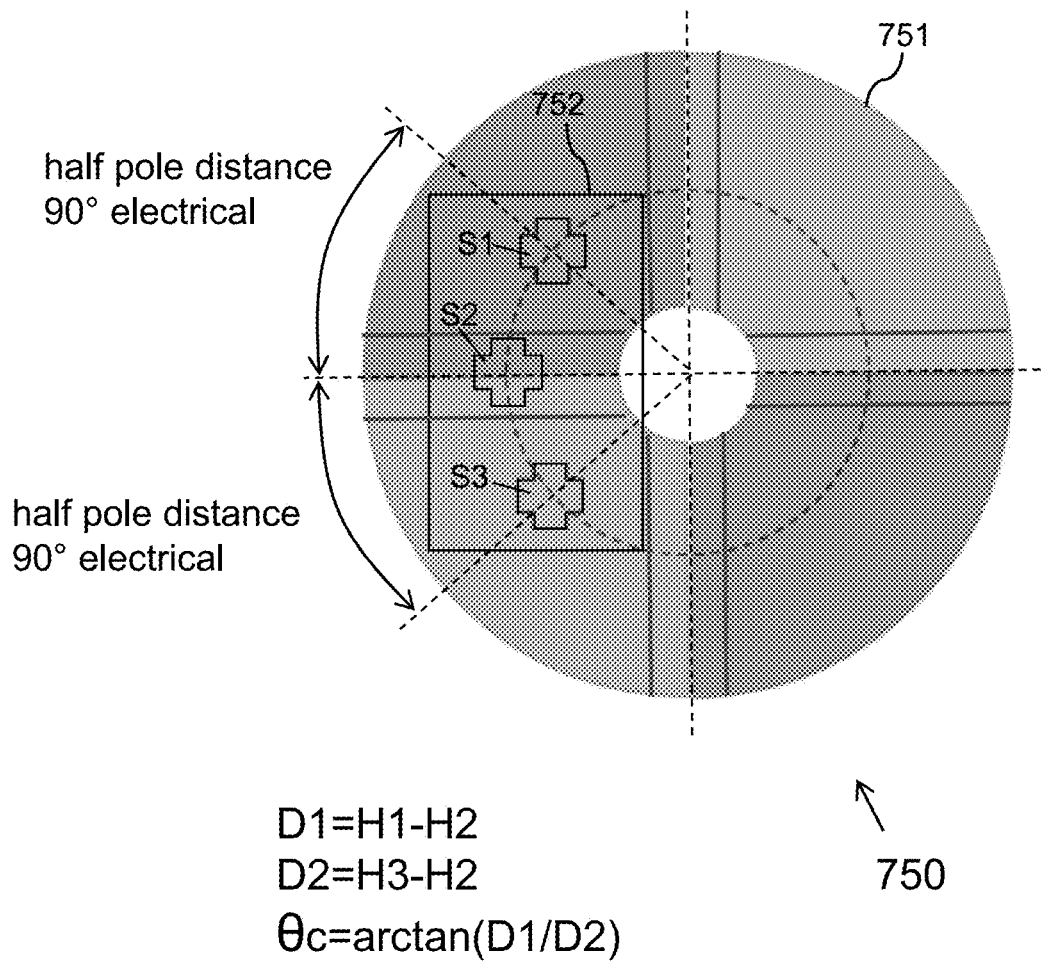
FIG. 7(e) shows a variant where the sensor elements are located on a triangle or on a circle, as another embodiment of the present invention.

In another or further variant of the embodiment shown in FIGS. 7(a) to 7(e), the system 750 comprises a magnet 751 with optimized grooves, and a sensor device 752 having three sensors S1, S2, S3 which are not located on a straight line, but located on a triangle or an imaginary circle, as illustrated in FIG. 7(e). In this embodiment, the amplitudes of the signals H1, H2, H3 provided by the sensor devices S1, S2, S3 may better match, and the accuracy may be further improved.

In another or further variant of this embodiment, the magnet is a six-pole magnet, or an eight-pole magnet, or a magnet having more than eight poles.

In a another or further variant of the embodiment shown in FIGS. 7(a) to 7(e), the sensor device contains only two sensor elements configured for measuring the magnetic field in the same direction, for example two horizontal Hall elements configured for measuring Bz1 and Bz2, or two vertical Hall elements, configured for measuring Bx1 and Bx2 at two spaced apart locations, and the processing circuit may be configured for determining the angular position as a function of these two signals, for example as an arctangent function of their ratio. In this case, no difference signals are calculated and the solution is not robust against an external disturbance field, but the accuracy can also be improved by making use of one or more "optimized" grooves.

Figure 8A:
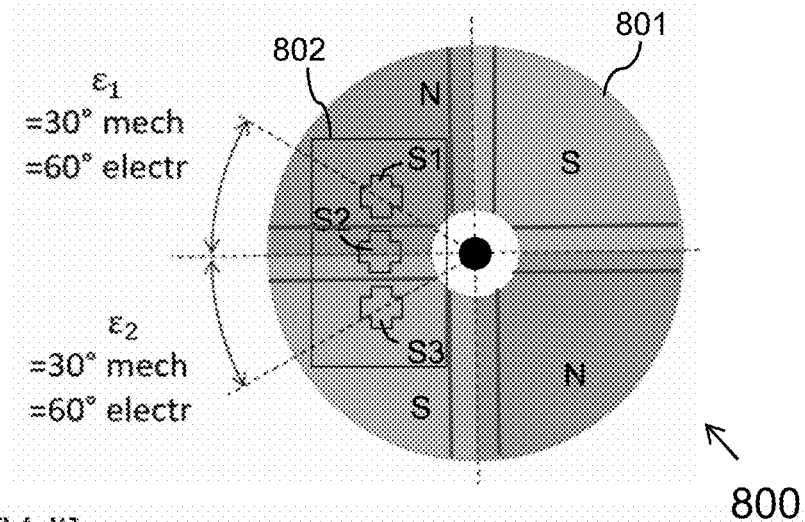
FIGS. 8(a) to 8(d) show another exemplary angular position sensor system according to an embodiment of the present invention, having a four-pole magnet with grooves, and having a sensor with three (e.g. only three) sensor elements spaced apart by less than half a pole distance (e.g. 60° electrical), and using an arctangent function.
Figure 8B:
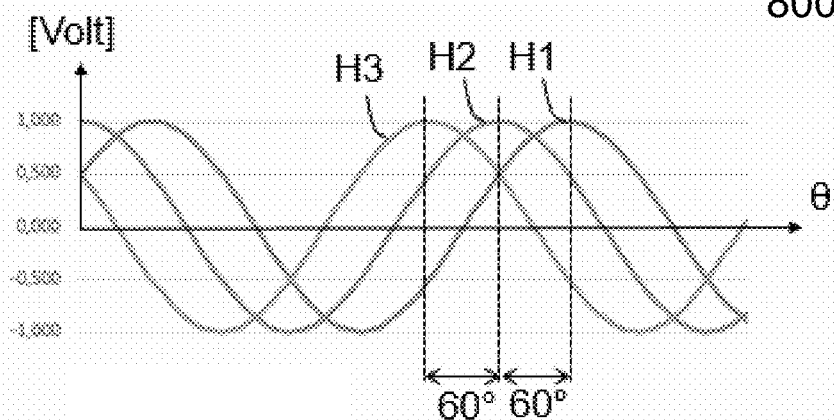

FIGS. 8(a) to 8(d) show another exemplary angular position sensor system 800, which can be seen as a variant of the sensor system of FIGS. 7(a) to 7(e), where the sensor elements are also spaced apart on a straight line, but not by half a pole distance. In the example shown, the distance between the sensor elements S1, S2 and the distance between the sensor elements S2, S3 is 30° mechanical or 60° electrical because of the four-pole ring magnet 801. In other words, the sensor elements are spaced such that the signals H1, H2, H3 provided by the sensor elements S1, S2, S3 are 60° phase shifted, as shown in FIG. 8(b).

Figure 8C:
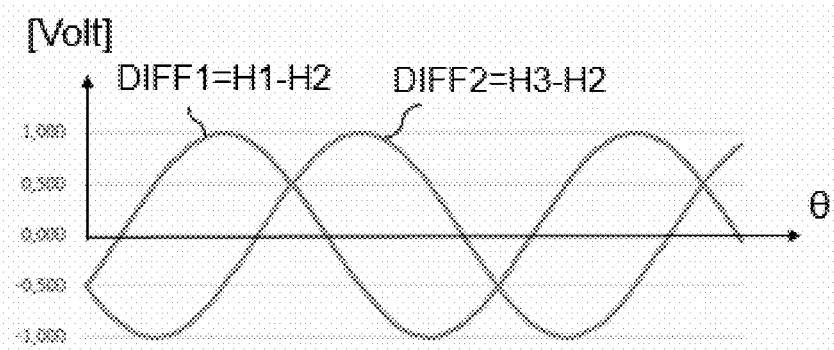
Figure 8D:
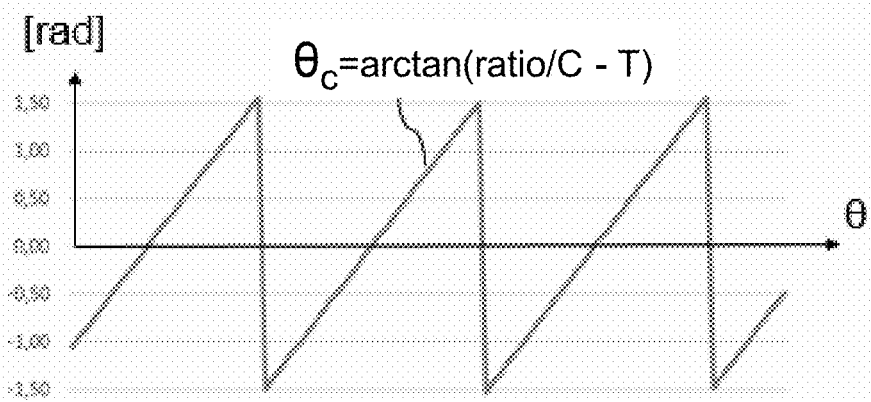

FIG. 8(c) shows that the difference signals D1=H1−H2 and D2=H3−H2 have equal amplitude, and are phase shifted, but not by 90°, hence the arctan function of the ratio of D1 and D2 will not provide a good angular position. However, as described in more detail in the co-pending patent application EP19175668.3 filed by the same applicant on 21 May 2019, incorporated herein by reference in its entirety, in particular in FIG. 2(a) to FIG. 4(f) and the associated text, an angle calculated in accordance with the following formulas does provide a good approximation of the angular position:

$$\text{ratio}=(H1-H2)/(H3-H2) \quad [16a]$$

$$\theta c = \arctan(\text{ratio}/C-T) \quad [16b]$$

where C and T are predefined constants, which may for example be determined during design, or during a calibration test.

According to an aspect of the present invention, the accuracy of the system described in the co-pending application can be further improved by using a ring or disk magnet having a plurality of grooves, e.g. radially oriented grooves applied to the planar surface facing the sensor device 802. As described above, the grooves have a predefined shape and size which can be described by a limited number of parameters, e.g. a groove with a constant cross-section having two rectangular cut-outs, the dimensions of which can be optimized for example using the method described above, or variants thereof, taking into account the relative position of the sensor device (e.g. axial distance and radial distance), and taking into account the formulas [16a, 16b].

The embodiment 800 has the same advantages mentioned in the referenced application, including highly insensitive to external disturbance field and ageing effects, possibility to use a single design with multiple magnet sizes (by choosing different parameters C and T, which may be stored during a calibration test), and now, thanks to the magnet with grooves, with the additional advantage of improved accuracy and/or reduced post-processing.

In a variant of the embodiment shown in FIGS. 8(*a*) to 8(*d*), the three sensors S1, S2, S3 are not located on a straight line, but are located on an imaginary triangle or circle, as illustrated in FIG. 5(*a*) to FIG. 5(*e*) of co-pending patent application EP19175668.3, similar to FIG. 7(*e*) except that the sensors need not be located at half pole distances. In such embodiment, the amplitudes of the signals H1, H2, H3 provided by the sensor devices may better match, and the accuracy may be further improved.

In another or further variant of the embodiment shown in FIGS. 8(*a*) to 8(*d*), the sensor device has four sensors S1, S2, S3, S4 which may be located on a straight line, (e.g. as illustrated in FIG. 6(*b*) of co-pending patent application EP19175668.3), or which may be located on a trapezium, (e.g. as illustrated in FIG. 6(*c*) of co-pending patent application EP19175668.3). Such embodiment offers the same advantages as described in the co-pending application, (e.g. in terms of redundancy and/or auto-calibration), but in addition offers an improved accuracy, thanks to the magnet with grooves.

In another or further variant of these embodiments, the magnet is a six-pole magnet, or an eight-pole magnet, or a magnet having more than eight poles.

In another or further variant, the sensor elements are vertical Hall elements, or magneto-resistive elements (e.g. GMR or)(MIR elements), configured for measuring Vx1, Vx2, Vx3 oriented in the X-direction, and $$DIFF1 = Vx1 - Vx2 \quad \text{[16c], and}$$

$$DIFF2 = Vx3 - Vx2 \quad \text{[16d]}$$

Figure 9A:
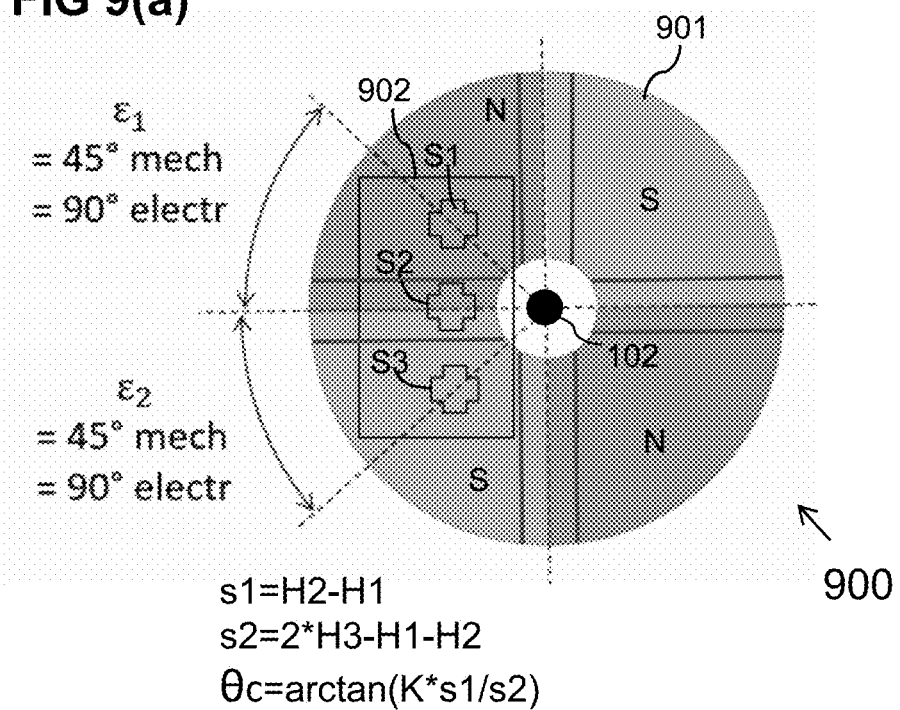
FIG. 9(a) shows a variant of the angular position sensor system of FIG. 7(a) as another embodiment of the present invention, where the angular position is calculated in a different manner.
Figure 9B:
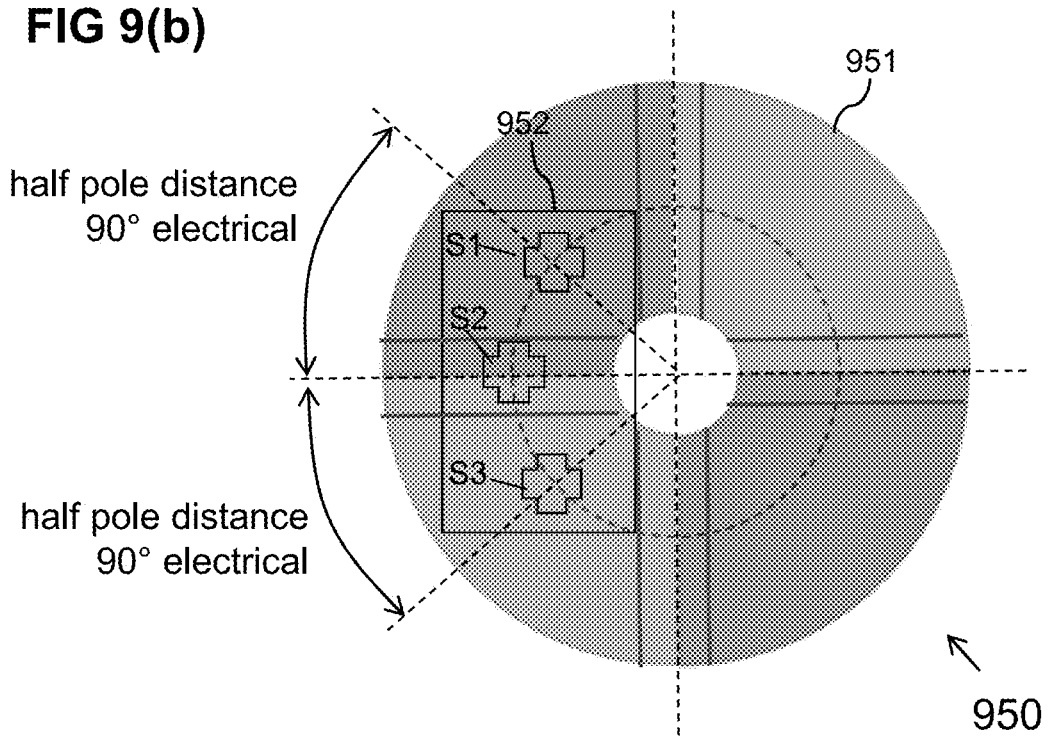
FIG. 9(b) shows a variant of FIG. 9(a) where the sensor elements are located on a triangle or on a circle, as another embodiment of the present invention.

FIG. 9(*a*) shows yet another variant of the embodiment of FIGS. 7(*a*) to 7(*e*), using the same mechanical arrangement with three horizontal Hall sensors S1, S2, S3, providing signals H1, H2, H3 respectively, but using different formulas to calculate the angle. Hence, also the grooves may be optimized differently. Such a sensor device is described in more detail in U.S. Pat. No. 8,089,275B2, incorporated herein by reference in its entirety. In order to apply the principles of the present invention, it suffices to know that in this embodiment, a first signal is provided in accordance with the following formula:

$$s1 = H2 - H1 \quad \text{[17a],}$$

and a second signal is provided in accordance with the following formula:

$$s2 = 2*H3 - H1 - H2 \quad \text{[17b]}$$

and the angular position is determined in accordance with the following formula:

$$\theta c = \arctan(K*s1/s2) \quad \text{[17c]}$$

where K is a predefined constant, or a dynamically adjusted value, chosen such that the amplitude of K*s1 and the amplitude of s2 are substantially the same. In this embodiment, the sensors are spaced apart over a half pole distance.

In a variant of this embodiment, the magnet is a six-pole magnet, or an eight-pole magnet, or a magnet having more than eight poles.

In another or further variant, the sensor elements are vertical Hall elements, or magneto-resistive elements (e.g. GMR or)(MIR elements), configured for measuring Vx1, Vx2, Vx3 oriented in the X-direction, and $$s1 = Vx2 - Vx1 \quad \text{[17d], and}$$

$$s2 = 2*Vx3 - Vx1 - Vx2 \quad \text{[17e]}$$

FIG. 9(*b*) shows an angular position sensor system 950 which is a variant of the angular position sensor system 900 of FIG. 9(*a*), using the same formulas, but comprising a slightly different sensor device 952 having three sensor elements S1, S2, S3 which are not located on a straight line, but located on an imaginary triangle. The sensor device 952 is preferably positioned such that the three sensors S1, S2, S3 are spaced apart substantially over half a pole distance, which in the case of a four-pole ring magnet corresponds to a 45° mechanical angle, and are located on an imaginary circle (indicated in dotted line) having a center on the rotation axis of the magnet 951.

In a variant of this embodiment, the magnet is a six-pole magnet, or an eight-pole magnet, or a magnet having more than eight poles.

Figure 10A:
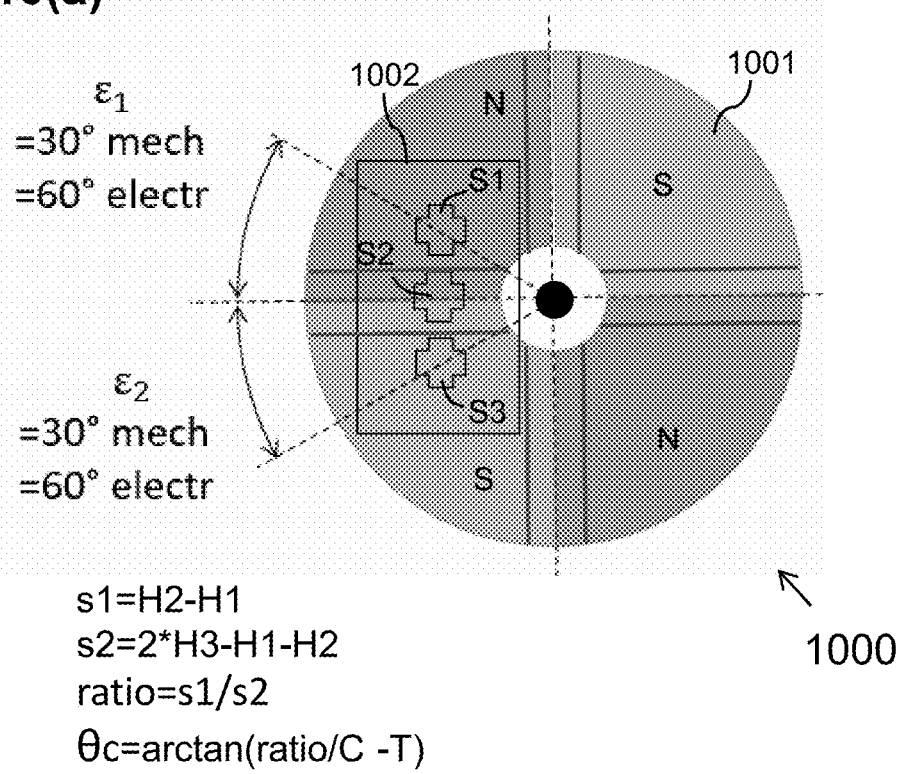
FIG. 10(a) shows another variant of the angular position sensor system of FIG. 9(a) having three sensor elements located on a straight line, spaced apart by less than half a pole distance (e.g. 60° electrical), using the same difference signals as in FIGS. 9(a) and 9(b), but using a modified arctangent function.
Figure 10B:
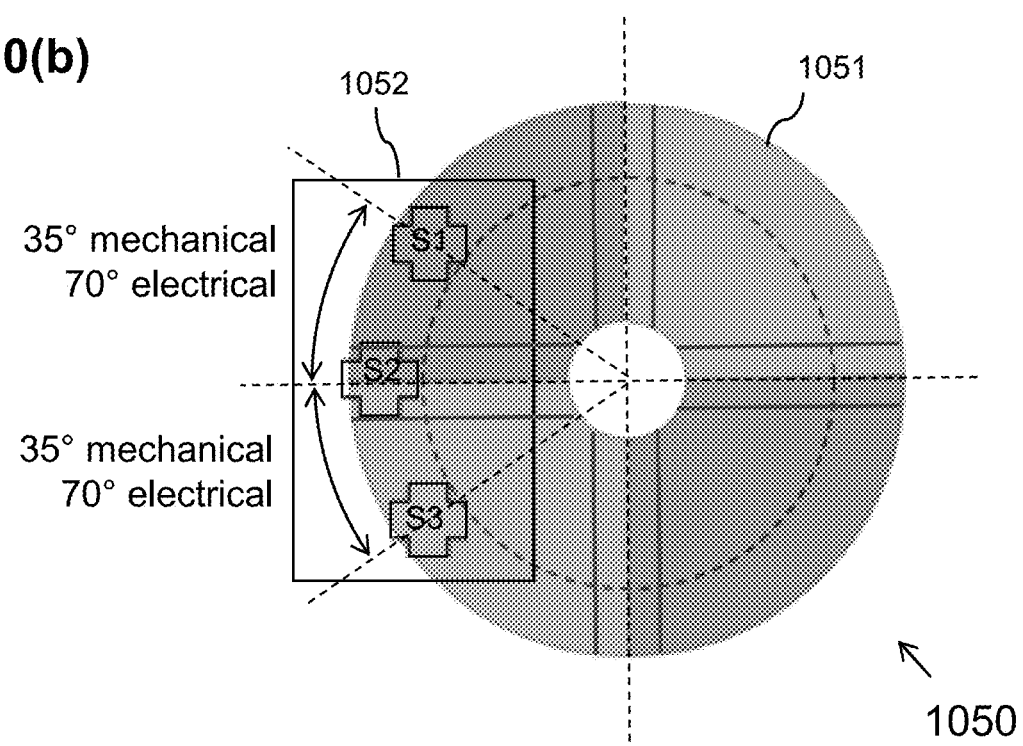
FIG. 10(b) shows a variant of FIG. 10(a) where the sensor elements are located on a triangle or on a circle, as another embodiment of the present invention.

FIG. 10(*a*) shows an angular position sensor system 1000 which can be seen as a variant of the angular position sensor system 900 of FIG. 9(*a*), wherein the sensors S1, S2, S3 are spaced apart by 30° mechanical, which is equivalent to 60° electrical for a four-pole magnet. In this embodiment, the sensor device 1002 calculates the angular position θc in accordance with the following set of formulas:

$$s1 = H1 - H2 \quad \text{[18a]}$$

$$s2 = 2*H3 - H1 - H2 \quad \text{[18b]}$$

$$\text{ratio} = s1/s2 \quad \text{[18c]}$$

$$\theta c = \arctan(\text{ratio}/C - T) \quad \text{[18d]}$$

where C and T are predefined constants which may be determined during design or by calibration, or where C and T are parameters which are determined dynamically. According to an aspect of the present invention, the magnet 1001 has a plurality of radial grooves, which are optimized for this arrangement, taking into account the relative position of the sensors S1, S2, S3 with respect to the magnet, and taking into account the formulas [18a-18d].

In a variant of this embodiment, the magnet is a six-pole magnet, or an eight-pole magnet, or a magnet having more than eight poles.

In another or further variant, the sensor elements are vertical Hall elements, or magneto-resistive elements (e.g. GMR or XMR elements), configured for measuring Vx1, Vx2, Vx3 oriented in the X-direction, and $$s1 = Vx2 - Vx1 \quad \text{[18e], and}$$

$$s2 = 2*Vx3 - Vx1 - Vx2 \quad \text{[18f]}$$

FIG. 10(*b*) shows an angular position sensor system 1050 which can be seen as a variant of angular position sensor system 1000 of FIG. 10(*a*). The system 1050 comprises a magnet 1051 and a sensor device 1052 comprising three sensor elements S1, S2, S3 which are not located on a straight line, but on an imaginary triangle, and preferably also on an imaginary circle having a centre on the rotation axis of the magnet. The sensor are spaced apart over a mechanical angle of 35°, hence the signals H1, H2, H3 provided by the sensors are phase shifted by 70° (in case of a four-pole magnet). This arrangement may further improve the accuracy of the system 1050. In accordance with an aspect of the present invention, the magnet 1051 has a plurality of radial grooves, which are optimized for this arrangement, the optimization taking into account the envisioned axial and radial distance, and the formulas [18a-18f].

In a variant of this embodiment, the magnet is a six-pole magnet, or an eight-pole magnet, or a magnet having more than eight poles.

Figure 11:
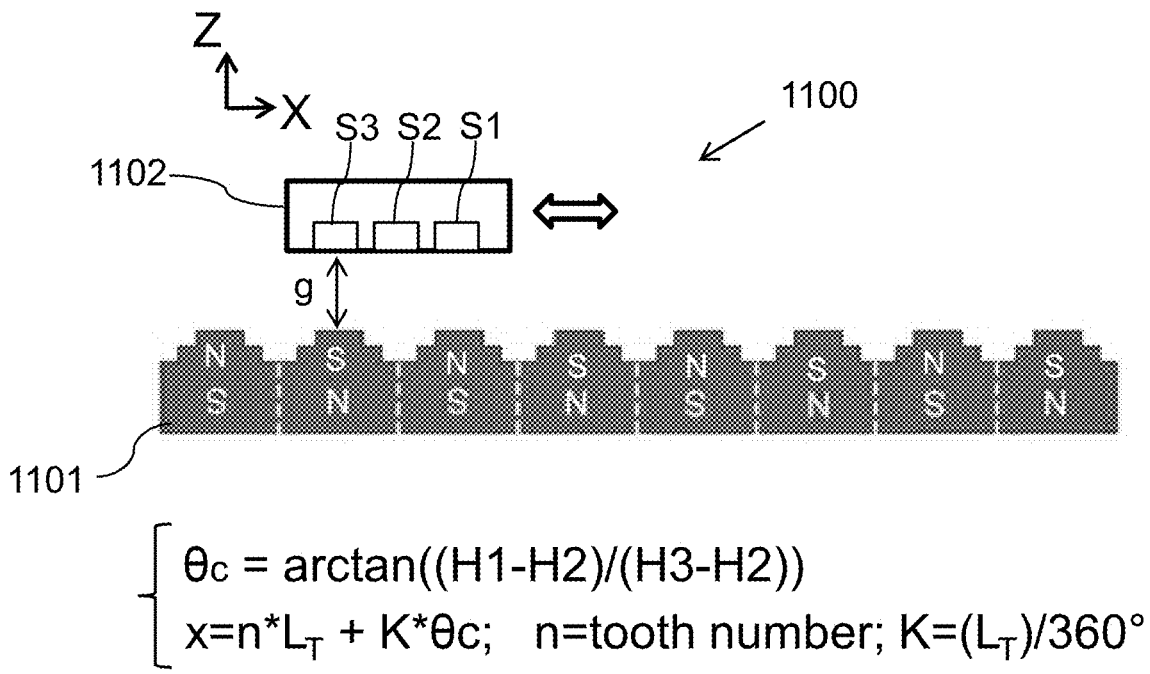
FIG. 11 shows a linear sensor system comprising a magnetic structure as in FIG. 4(a) and a sensor device as in FIG. 7(a) as another embodiment of the present invention. The sensor elements are spaced by half a pole distance.

FIG. 11 shows a linear sensor system 1100 comprising an elongated magnetic structure 1101 similar to that of FIG. 4(a), in combination with a sensor device 1102 similar to that of FIG. 7(a), having three horizontal Hall elements S1, S2, S3 located on a straight line, and spaced apart by half a pole distance. The sensor device 1102 may determine the linear position Xc in accordance with the following formulas:

$$Xc = n*L_T + K*\theta c \qquad [19a]$$

where Xc represents the calculated position in the movement direction X, where "n" represents the number of the tooth under or above which the sensor device 1102 is located (which can for example be counted by the sensor device), and $L_T$ represents the length of one tooth in the movement direction X, K is a predefined constant equal to $L_T/360°$, and θc is an angular position which (in the example) is determined as a function of the signals obtained from the horizontal Hall elements, in accordance with the following formula:

$$\theta c = \arctan((H1-H2)/(H3-H2)) \qquad [19b]$$

where H1, H2, H3 are the signals provided by the sensor elements S1, S2, S3 respectively.

Optimized grooves (optimal or sub-optimal) can be found using the algorithm described above, taking into account given boundary conditions, such as e.g. given distance "g" between the magnetic structure 1101 and the sensor device 1102, and taking into account the formulas [19a] and [19b].

Figure 12:
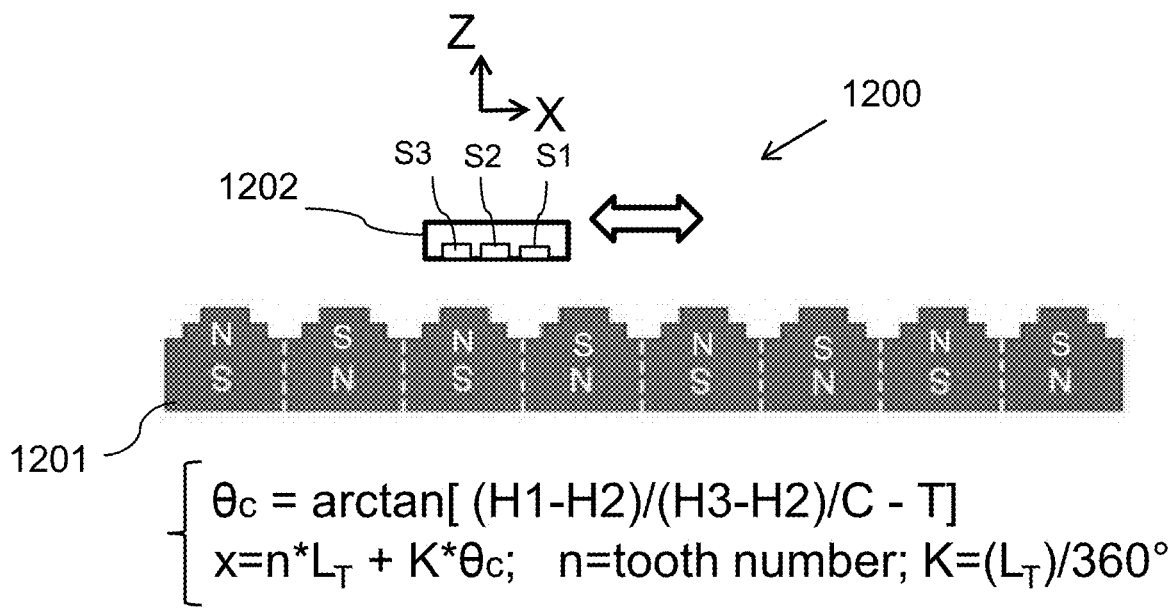
FIG. 12 shows a variant of FIG. 11, wherein the sensor elements are spaced by less than half a pole distance, as another embodiment of the present invention.

FIG. 12 shows a linear sensor system 1200 which can be regarded as a variant of the sensor system 1100 of FIG. 11, comprising a magnetic structure 1201 magnetized in the Z-direction, and a sensor device 1202 having three horizontal Hall elements S1, S2, S3 located on a straight line, but not spaced apart by half a pole distance, but for example by 10% to 45% or 55% to 90% of the pole distance of the magnetic structure 1201. The sensor device 1202 can determine the linear position in accordance with the following formulas:

$$Xc = n*L_T + K*\theta c \qquad [20a]$$

where Xc represents the calculated position in the movement direction X, "n" represents the number of the tooth under or above which the sensor device 1202 is located (which can for example be counted by the sensor device), and $L_T$ represents the length of one tooth in the movement direction X, K is a predefined constant equal to $L_T/360°$, and Oc is a calculated angular position which (in the example) is determined as a function of the signals obtained from the horizontal Hall elements, in accordance with the following formula:

$$ratio = ((H1-H2)/(H3-H2) \qquad [20b]$$

$$\theta c = \arctan(ratio/C-T) \qquad [20c]$$

where H1, H2, H3 are the signals provided by the sensor elements S1, S2, S3 respectively, and C and T are predefined constants, which can be determined by design or by calibration.

Optimized (e.g. optimal or sub-optimal) grooves can be found using the algorithm described above (for a linear sensor system), taking into account given boundary conditions (e.g. outer dimensions of the magnetic structure 1201, a particular groove shape), the given target distance "g" between the magnetic structure 1201 and the sensor device 1202 (e.g. equal to about 2.0 mm), and taking into account the formulas [20a] to [20c].

The many embodiments described herein and in the documents referred to, illustrate that the present invention works with various sensor devices having various sensor topologies, e.g. comprising horizontal Hall elements with or without IMC, and/or vertical Hall elements, and/or magneto-resistive elements, and may be based for example on Bx, By or Bz signals and/or spatial derivatives thereof.

Figure 13A:
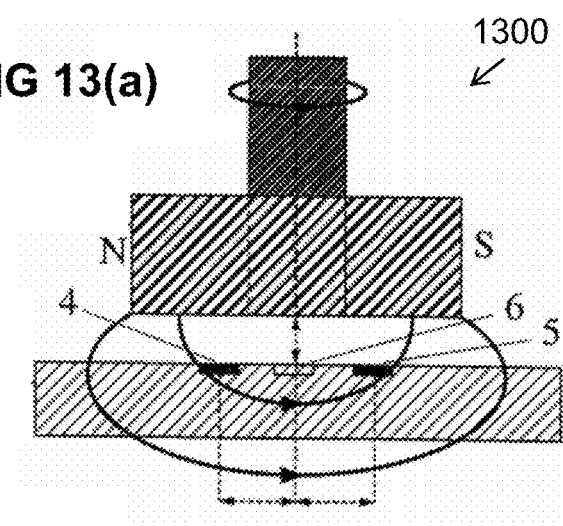
Figure 13B:
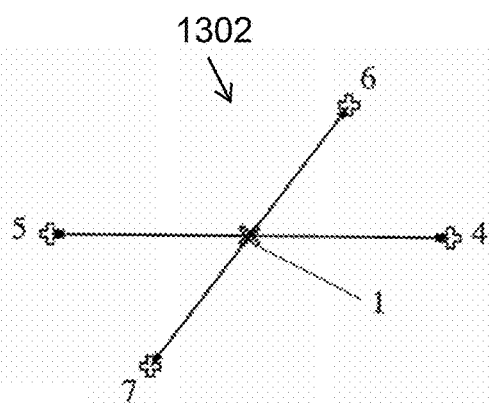

FIGS. 13(a) to 13(c) show an angular position sensor system 1300 known from WO9854547A1, incorporated herein by reference.

FIG. 13(a) is a replica of FIG. 1(a) thereof and represents a magnet which is rotatable relative to a substrate, and FIG. 13(b) is a replica of FIG. 2(b) thereof, showing a perspective view on the sensor elements of the sensor device. The magnet used in the embodiment of FIG. 13(a) is a bar magnet.

The sensor device 1302 contains four horizontal Hall elements 4, 5, 6, 7 arranged on a circle, and configured for providing signals S4, S5, S6, S7 respectively. The sensor elements are spaced apart by multiples of 90° (shown in perspective view in FIG. 13(b)). A first difference signal is calculated as S7-S6. A second difference signal is calculated as S5-S4. An angular position of the magnet can be calculated by using the formula:

$$\theta c = \arctan((S7-S6)/(S5-S4)) \qquad [21]$$

where S4 and S5 are located diametrically opposite each other, and S6 and S7 are located diametrically opposite each other.

FIG. 14 shows an angular sensor system 1400 according to an embodiment of the present invention, using a two-pole disk magnet 1401, which can be seen as a variant of the sensor system 1300 of FIG. 13(a). The same sensor device as that of [135] FIGS. 13(a) to 13(c) may be used. The sensor device 1402 has four horizontal Hall elements located on an imaginary circle, the circle having a center located on the rotation axis of the magnet. Or in other words, the sensor device 1402 is arranged in an "on-axis" position.

When expressed in terms of the X, Y, Z coordinate system fixed to the sensor device 1402, the formula [21] can also be written as:

$$\theta c = \arctan((dBz/dx)/(dBz/dy)) \qquad [22a], \text{ or as:}$$

$$\theta c = \arctan 2(dBz/dx, dBz/dy) \qquad [22b]$$

As can be seen, the magnet 1401 has a single groove, in the example shown having a single rectangular cut-out, but other grooves can also be used, e.g. as illustrated in FIGS. 17(a) to 17(f). The groove is "optimized" in a manner similar as described above, taking into account the formula [22a] or [22b].

This embodiment shows that the principles of the present invention also works for a two-pole magnet and spatial gradients of Bz along the X and the Y direction, perpendicular to the rotation axis.

In a variant, the sensor device of FIG. 14 is configured for determining a second order gradient of Bx along the X-direction, and a second order gradient of By along the Y-direction, and for calculating the angular position in accordance with the following formula:

$$\theta c = a\tan 2(d^2Bx/dx^2, d^2By/dy^2) \quad [24]$$

Such a sensor device is described for example in more detail in FIG. 14 to FIG. 20 of EP19193074.2, filed by the same applicant on 22 Aug. 2019 incorporated herein by reference in its entirety, but the present invention is not limited thereto, and other sensor structures for determining said second order gradients can also be used. In addition to what is described in that application, the magnet further comprises one or more grooves (similar to those shown in FIG. 14), having a shape and size which can be described by a limited number of parameters (e.g. at most 15 parameters, or at most 12, or at most 10, or at most 8, or at most 5, or at most 4, or at most 3), the values of which parameters can be optimized by performing simulations in a manner similar as described above, taking into account the sensor topology of the envisioned sensor, and formula [24].

FIG. 15 shows a variant of FIG. 14 using a ring magnet instead of a disk magnet. The magnet 1501 contains two grooves.

Figure 16G:
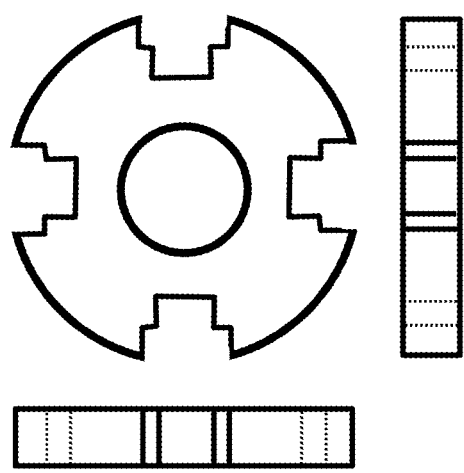
Figure 16H:
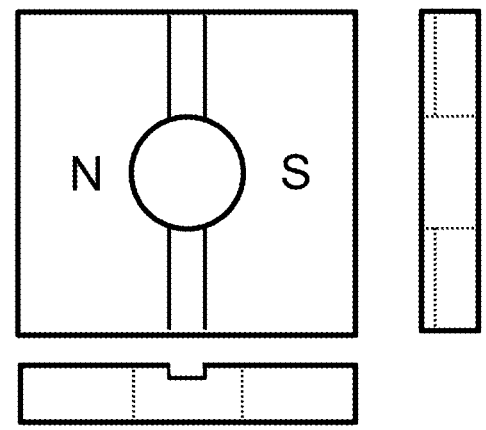

In another variant of FIG. 14 (not shown), the magnet is a bar magnet with a groove, or a cuboid magnet with a groove, for example as schematically illustrated in FIG. 16(h), but other two-pole magnets may also be used.

FIGS. 16(a) to 16(h) show a few examples of two-pole or multi-pole ring magnets or disk magnets or bar magnets or cuboid magnets with radial or axial grooves, as can be used in embodiments of the present invention, but of course, the present invention is not limited to these examples, and other grooves can also be used. For example, the grooves in FIGS. 16(a) to 16(h) have a constant depth, but that is not required for the present invention to work, and grooves which are inclined relative to the magnet surface (or stated otherwise: having a varying depth) can also be used. Such a groove can also be optimized by considering one or more additional parameters, e.g. inclination angle; or for example a first groove depth near the central opening and a second groove depth near the outer periphery. The grooves are preferably located at the transitions between north and south-poles. They may extend over the entire radial distance, or only a portion thereof, e.g. an inner portion as in FIG. 16(c), or a central portion (not shown) or an outer portion (not shown). FIG. 16(g) shows an example of axial grooves, as can be used in the embodiments of FIGS. 5(a) to 5(d) and FIGS. 6(a) to 6(d). The skilled person having the benefit of the present disclosure can easily think of other variants. It is pointed out that the grooves shown in FIGS. 16(a) to 16(h) have a cross-section with a single rectangular cut-out, but the present invention is not limited thereto, and grooves having another cross-section can also be used, for example as illustrated in FIGS. 17(a) to 17(f).

FIGS. 17(a) to 17(f) show several examples of groove shapes which can be described by a limited set of parameters. More in particular, FIG. 17(a) shows a groove cross-section having a single rectangular cut-out, the size of which can be described by two parameter values, for example width and depth, of if parameter h1 is given, by the parameters d1, h2, or in any other suitable way.

FIG. 17(b) shows a groove cross-section having two rectangular cut-outs, the size of which can be described by four parameter values, FIG. 17(c) shows a groove cross-section having a trapezoidal cut-out, the size of which can be described by three parameter values, FIG. 17(d) shows a groove cross-section having a polygonal or piece-wise linear cut-out, the size of which can be described by five parameter values, FIG. 17(e) shows a groove cross-section having a circular cut-out, the size of which can be described by two parameter values, FIG. 17(f) shows a groove cross-section having a triangular cut-out, the size of which can be described by two parameter values, but of course the present invention is not limited to these grooves, or to these parameter representations, and other shapes and/or parameters can also be used, for example a groove having a parabolic cut-out (not shown).

For completeness, it is noted that magnets with grooves can be produced in several ways. For example, by molding or sintering ceramic magnetic particles, or by injection moulding magnetic particles in a plastic matrix material, or by machining existing magnets, etc.

In the examples described above, some parameters of the ring or disk magnet are considered to be given (e.g. the thickness h1, the inner radius Ri, the outer radius Ro), but it is of course also possible to vary one or more of these parameters (within certain boundaries), and take the best solution, for example the solution providing the most accurate result.

The invention has been described above assuming that a particular shape of the groove is given, (for example a groove having two rectangular cut-outs), and for that given shape, an optimal size is determined. However, the present invention is not limited thereto, and it is of course also possible to optimize multiple shapes, for example a selection of two of the shapes of FIGS. 17(a) to 17(f), or even all of the shapes of FIGS. 17(a) to 17(f), and select the best result of those shapes as "the overall optimized" groove.

As pointed out above, even a sub-optimal groove can still be a major improvement over the prior art. Therefore, any solution (e.g. parameter set) that reduces the maximum error between the actual mechanical position and the calculated position by at least a factor of 2 (e.g. at least a factor 3, or at least a factor 4, or at least a factor 5, or at least a factor 8, or at least a factor 10) is considered a "solution" according to the present invention, as defined by the independent claims.

While the present invention has been explained primarily for grooves having a constant cross-section (thus a constant width and a constant depth), and extending over the full diameter or full height or full width of the magnetic structure, it is contemplated that this is not absolutely required for the present invention to work, and the grooves may also have a shorter length, and/or may have a varying depth and/or a varying width, e.g. a linearly varying depth and/or a linearly varying width. Since such grooves can also be modelled by a limited number of parameters (for example at most 15 or at most 12 or at most 10 parameters), and hence can also be optimized using one of the algorithms described herein, or variants thereof, all angular and linear position sensor systems comprising grooves which can be defined by a limited set of parameters are considered to fall within the scope of the present invention, as defined by the claims.

The processing circuit may comprise analog circuitry, digital circuitry, a programmable processor, and combinations hereof.

The invention claimed is:

1. An angular position sensor system comprising:
    a multi-pole magnetic structure for generating a magnetic field; and
    a sensor device movable relative to the magnetic structure about a rotation axis, or vice versa;
    the sensor device comprising a plurality of sensor elements configured for measuring at least two magnetic field characteristics, and a processing circuit configured for determining an angular position of the sensor device in accordance with a predefined function of these at least two magnetic field characteristics;
    wherein the sensor device is located such that the sensor elements are located at a radial distance of at least 1.6 mm from said rotation axis; and
    said magnetic structure comprises a plurality of grooves having a shape and size which can be described by a limited set of parameters, these parameters having values which are optimized so as to reduce a maximum error between the actual position of the sensor device and the position determined in accordance with said predefined function, by at least a factor of 2.

2. The angular position sensor system according to claim 1,
    wherein the sensor device is configured for measuring at least two magnetic field components oriented in a different direction; and
    wherein the processing circuit is configured for determining the angular position in accordance with said predefined function of these at least two magnetic field components.

3. The angular position sensor system according to claim 1,
    wherein the sensor device is configured for measuring at least two magnetic field gradients; and
    wherein the processing circuit is configured for determining the angular position in accordance with said predefined function of these at least two magnetic field gradients.

4. The angular position sensor system according to claim 1,
    wherein the plurality of sensor elements comprises at least two sensor elements located at two different positions spaced apart from each other, configured for measuring at least two magnetic field components, oriented in parallel, and
    wherein the processing circuit is configured for determining the angular position in accordance with a predefined function of these at least two magnetic field components; or
    wherein the plurality of sensor elements comprises at least three sensor elements located at three different positions spaced apart from each other, configured for measuring at least three magnetic field components, oriented in parallel, and
    wherein the processing circuit is configured for determining the angular position in accordance with a predefined function of these at least three magnetic field components.

5. The angular position sensor system according to claim 4, wherein the processing circuit is configured for determining a first difference between a first pair of the three signals, and for determining a second difference between a second pair of these three signals, different from the first pair, and for determining the angular position in accordance with a predefined function of the first and second differences.

6. The angular position sensor system according to claim 4, wherein the processing circuit is configured for determining a difference between a first pair of the three signals, and for determining a linear combination of the three signals different from said difference, and for determining the angular position in accordance with a predefined function of said difference and said linear combination.

7. The angular position sensor system according to claim 1, wherein the magnetic structure is a ring magnet or disk magnet having at least four poles, or at least six poles, or at least eight poles.

8. The angular position sensor system according to claim 1, wherein the magnetic structure comprises one or more materials selected from the group consisting of: AlNiCo, ferrite, SmCo, and NdFeB.

9. The angular position sensor system according to claim 1, wherein the predefined function is an arctangent function of a ratio of two signals.

10. The angular position sensor system according to claim 1,
    wherein the groove or grooves has/have a constant cross section; and/or
    wherein the groove or grooves has/have a shape and size which can be described by at most 15 parameters; and/or
    wherein the groove or grooves has/have a shape selected from the group consisting of: rectangle, square, trapezoidal, piece-wise-linear, polygonal, circular, elliptical, triangular, parabolic, or combinations of one or more of these.

11. A linear position sensor system comprising:
    a multi-pole magnetic structure having an elongated shape, and having a plurality of magnetic poles for generating a magnetic field;
    a sensor device movable relative to the magnetic structure at a substantially constant distance (g) from the magnetic structure, or vice versa;
    the sensor device comprising a plurality of sensor elements configured for measuring at least two magnetic field characteristics, and a processing circuit configured for determining a linear position of the sensor device relative to the magnetic structure in accordance with a predefined function of these at least two magnetic field characteristics;
    wherein said magnetic structure comprises one or more transverse grooves oriented in a transverse direction of said elongated shape perpendicular to the relative direction of movement, and having a shape and size which can be described by a limited set of parameters, these parameters having values which are optimized so as to reduce a maximum error between the actual position of the sensor device relative to the magnetic structure and the position determined in accordance with said predefined function, by at least a factor of 2.

12. The linear position sensor system according to claim 11,
    wherein the sensor device further comprises a semiconductor substrate; and
    wherein the sensor device is configured for measuring a first magnetic field component parallel to the semiconductor substrate and parallel to the direction of movement, and a second magnetic field component perpendicular to the semiconductor substrate and perpendicular to the direction of movement; and
    wherein the processing circuit is configured for determining the linear position in accordance with an arctangent function of a ratio of these magnetic field components.

13. The linear position sensor system according to claim 11,
wherein the sensor device further comprises a semiconductor substrate; and
wherein the sensor device is configured for measuring a first magnetic field gradient of a first magnetic field component parallel to the semiconductor substrate along the direction of movement, and a second magnetic field gradient of a second magnetic field component perpendicular to the semiconductor substrate along said direction of movement; and
wherein the processing circuit is configured for determining the linear position in accordance with an arctangent function of a ratio of these magnetic field gradients.

14. The linear position sensor system according to claim 11,
wherein the plurality of sensor elements comprises at least two sensor elements located at two different positions spaced apart from each other, configured for measuring at least two magnetic field components, oriented in parallel, and
wherein the processing circuit is configured for determining the linear position in accordance with a predefined function of these at least two magnetic field components; or
wherein the plurality of sensor elements comprises at least three sensor elements located at three different positions spaced apart from each other, configured for measuring at least three magnetic field components, oriented in parallel, and
wherein the processing circuit is configured for determining the linear position in accordance with a predefined function of these at least three magnetic field components.

15. The linear position sensor system according to claim 14, wherein the processing circuit is configured for determining a first difference between a first pair of the three signals, and for determining a second difference between a second pair of these three signals, different from the first pair, and for determining the angular position in accordance with a predefined function of the first and second differences.

16. The linear position sensor system according to claim 11, wherein the predefined function is an arctangent function of a ratio of two signals.

17. The linear position sensor system according to claim 11,
wherein the groove or grooves has/have a constant cross section; and/or
wherein the groove or grooves has/have a shape and size which can be described by at most 15 parameters; and/or
wherein the groove or grooves has/have a shape selected from the group consisting of: rectangle, square, trapezoidal, piece-wise-linear, polygonal, circular, elliptical, triangular, parabolic, or combinations of one or more of these.

18. An angular position sensor system comprising:
a magnetic structure for generating a magnetic field; and
a sensor device movable relative to the magnetic structure about a rotation axis, or vice versa;
the sensor device comprising a plurality of sensor elements configured for measuring at least two magnetic field characteristics, and a processing circuit configured for determining an angular position of the sensor device relative to the magnetic structure in accordance with a predefined function of these at least two magnetic field characteristics;
wherein the magnetic structure is a two-pole magnet; and
the sensor device is located such that a magnetic center of the sensor elements is located substantially on said rotation axis; and
said magnetic structure comprises one or more grooves having a shape and size which can be described by a limited set of parameters, these parameters having values which are optimized so as to reduce a maximum error between the actual angular position of the sensor device and the angular position determined in accordance with said predefined function, by a factor of at least 2.

19. The angular position sensor system according to claim 18,
wherein the sensor device is configured for measuring two first order magnetic field gradients of the axial magnetic field component (Bz) along two orthogonal directions (X, Y) perpendicular to the rotation axis, and wherein the processing circuit is configured for determining the angular position in accordance with a predefined function of these first order magnetic field gradients, for example in accordance with the following formula: $\theta c = \arctan 2(dBz/dx, dBz/dy)$; or
wherein the sensor device is configured for determining two second order magnetic field gradients ($d^2Bz/dx^2$, $d^2Bz/dy^2$) of the axial magnetic field component (Bz) along two orthogonal directions (X, Y) perpendicular to the rotation axis, and
wherein the processing circuit is configured for determining the angular position in accordance with a predefined function of these second order magnetic field gradients, for example in accordance with the formula: $\theta c = \arctan 2(d^2Bz/dx^2, d^2Bz/dy^2)$; or
wherein the sensor device is configured for determining two second order magnetic field gradients ($d^2Bx/dx^2$, $d^2By/dy^2$) of two magnetic field components (Bx, By) oriented in orthogonal directions (X, Y) in a plane perpendicular to the rotation axis, the second order spatial derivative being determined along its respective axis (X, Y), and
wherein the processing circuit is configured for determining the angular position in accordance with a predefined function of these second order magnetic field gradients, for example in accordance with the formula: $\theta c = \arctan 2(d^2Bx/dx^2, d^2By/dy^2)$.

20. The angular position sensor system according to claim 19, wherein the predefined function is an arctangent function of a ratio of two signals.

21. The angular position sensor system according to claim 19,
wherein the groove or grooves has/have a constant cross section; and/or
wherein the groove or grooves has/have a shape and size which can be described by at most 15 parameters; and/or
wherein the groove or grooves has/have a shape selected from the group consisting of: rectangle, square, trapezoidal, piece-wise-linear, polygonal, circular, elliptical, triangular, parabolic, or combinations of one or more of these.

* * * * *